(12) United States Patent
Onodera et al.

(10) Patent No.: US 10,763,042 B2
(45) Date of Patent: Sep. 1, 2020

(54) ELECTRONIC COMPONENT

(71) Applicant: TDK CORPORATION, Tokyo (JP)

(72) Inventors: Shinya Onodera, Tokyo (JP); Takehisa Tamura, Tokyo (JP); Atsushi Takeda, Tokyo (JP); Ken Morita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 33 days.

(21) Appl. No.: 16/166,493

(22) Filed: Oct. 22, 2018

(65) Prior Publication Data

US 2019/0131072 A1    May 2, 2019

(30) Foreign Application Priority Data

Oct. 30, 2017   (JP) ................. 2017-209405

(51) Int. Cl.
*H01G 4/232*     (2006.01)
*H01G 4/012*     (2006.01)
(Continued)

(52) U.S. Cl.
CPC ........... *H01G 4/2325* (2013.01); *H01G 2/065* (2013.01); *H01G 4/012* (2013.01); *H01G 4/12* (2013.01); *H01G 4/232* (2013.01); *H01G 4/252* (2013.01); *H01G 4/30* (2013.01); *H01L 41/0472* (2013.01); *H01C 1/148* (2013.01); *H01C 7/008* (2013.01); *H01C 7/18* (2013.01); *H01F 17/0013* (2013.01); *H01F 27/292* (2013.01);
(Continued)

(58) Field of Classification Search
CPC ...... H01G 4/2325; H01G 2/065; H01G 4/012; H01G 4/12; H01G 4/232; H01G 4/252; H01G 4/30; H01G 4/1227; H01G 4/1245; H01G 4/248; H01L 41/0472; H01C 1/148; H01C 7/008; H01C 7/18; H01F 17/0013; H01F 27/292

See application file for complete search history.

(56) References Cited

U.S. PATENT DOCUMENTS

2015/0116896 A1*  4/2015  Inazuka ............... H01G 4/1227
                                                            361/301.4
2015/0364258 A1* 12/2015  Hattori ..................... H01G 4/30
                                                            361/301.4
(Continued)

FOREIGN PATENT DOCUMENTS

JP        H08-107038 A        4/1996
JP        2018-088451 A       6/2018

*Primary Examiner* — Dion Ferguson
(74) *Attorney, Agent, or Firm* — Oliff PLC

(57) ABSTRACT

An element body of a rectangular parallelepiped shape includes a first principal surface arranged to constitute a mounting surface, a second principal surface opposing the first principal surface in a first direction, a pair of side surfaces opposing each other in a second direction, and a pair of end surfaces opposing each other in a third direction. An external electrode is disposed at an end portion of the element body in the third direction. A first length of the element body in the first direction is different from a second length of the element body in the second direction. The external electrode includes a conductive resin layer. The conductive resin layer continuously covers one part of the first principal surface, one part of the end surface, and one part of each of the pair of side surfaces.

20 Claims, 18 Drawing Sheets

(51) Int. Cl.

| | | |
|---|---|---|
| *H01G 4/30* | (2006.01) | |
| *H01G 4/252* | (2006.01) | |
| *H01L 41/047* | (2006.01) | |
| *H01G 2/06* | (2006.01) | |
| *H01G 4/12* | (2006.01) | |
| H01G 4/248 | (2006.01) | |
| H01F 27/29 | (2006.01) | |
| H01C 7/00 | (2006.01) | |
| H01F 17/00 | (2006.01) | |
| H01C 7/18 | (2006.01) | |
| H01C 1/148 | (2006.01) | |

(52) U.S. Cl.
CPC ......... *H01G 4/1227* (2013.01); *H01G 4/1245* (2013.01); *H01G 4/248* (2013.01)

(56) References Cited

U.S. PATENT DOCUMENTS

| | | | |
|---|---|---|---|
| 2016/0049256 A1* | 2/2016 | Kitano | H01G 4/30 |
| | | | 361/301.4 |
| 2016/0093439 A1* | 3/2016 | Fujita | H01G 4/228 |
| | | | 361/301.4 |
| 2016/0099106 A1* | 4/2016 | Kurokawa | H01G 4/0085 |
| | | | 361/301.4 |
| 2016/0234979 A1* | 8/2016 | Lee | H01G 4/40 |
| 2018/0151296 A1* | 5/2018 | Yamada | H01G 2/065 |
| 2018/0268998 A1* | 9/2018 | Onodera | H01G 4/2325 |
| 2019/0096576 A1* | 3/2019 | Onodera | H01G 2/065 |
| 2019/0131070 A1* | 5/2019 | Onodera | H01G 4/005 |

* cited by examiner

ELECTRONIC COMPONENT

BACKGROUND OF THE INVENTION

1. Field of the Invention

The present invention relates to an electronic component.

2. Description of Related Art

Known electronic components include an element body of a rectangular parallelepiped shape and a plurality of external electrodes (see, for example, Japanese Unexamined Patent Publication No. H8-107038). The element body includes a pair of principal surfaces opposing each other, a pair of end surfaces opposing each other, and a pair of side surfaces opposing each other. The plurality of external electrodes is disposed at each end portion of the element body in a direction in which the pair of end surfaces opposes each other. The external electrode includes a conductive resin layer. The conductive resin layer continuously covers the entire end surface, one part of each of the principal surfaces, and one part of each of the pair of side surfaces.

SUMMARY OF THE INVENTION

An object of one aspect of the present invention is to provide an electronic component that suppresses occurrence of a crack in an element body and improves moisture resistance reliability.

An electronic component according to one aspect includes an element body of a rectangular parallelepiped shape, a plurality of internal conductors, and a plurality of external electrodes. The element body includes a first principal surface arranged to constitute a mounting surface, a second principal surface opposing the first principal surface in a first direction, a pair of side surfaces opposing each other in a second direction, and a pair of end surfaces opposing each other in a third direction. The plurality of internal conductors is disposed in the element body to be disposed in a predetermined direction of the first direction and second direction. The plurality of external electrodes is disposed at both end portions of the element body in the third direction. A first length of the element body in the first direction is different from a second length of the element body in the second direction. The external electrode includes a conductive resin layer. The conductive resin layer continuously covers one part of the first principal surface, one part of the end surface, and one part of each of the pair of side surfaces.

In a case in which the electronic component is solder-mounted on an electronic device, external force applied onto the electronic component from the electronic device may act as stress on the element body. The electronic device includes, for example, a circuit board or an electronic component. The external force acts on the element body from a solder fillet formed at the solder-mounting, through the external electrode. In this case, a crack may occur in the element body. The external force tends to act on a region defined by one part of the principal surface arranged to constitute a mounting surface, one part of the end surface, and one part of the pair of side surfaces, in the element body.

In the one aspect, the conductive resin layer continuously covers the one part of the first principal surface, the one part of the end surface, and the one part of each of the pair of side surfaces. Therefore, the external force applied onto the electronic component from the electronic device tends not to act on the element body. Consequently, the one aspect suppresses occurrence of a crack in the element body.

In a case in which an element is described as covering another element, the element may directly cover the other element or indirectly cover the other element.

A region between the element body and the conductive resin layer may include a path through which moisture infiltrates. In a case in which moisture infiltrates from the region between the element body and the conductive resin layer, durability of the electronic component decreases. The one aspect includes few paths through which moisture infiltrates, as compared with a configuration in which the conductive resin layer covers the entire end surface, one part of each of the principal surfaces, and one part of each of the pair of side surfaces. Therefore, the one aspect improves moisture resistance reliability.

In the one aspect, the plurality of internal conductors is disposed in a predetermined direction of the first direction and second direction in the element body. The first length of the element body in the first direction is different from the second length of the element body in the second direction. Therefore, the direction in which the internal conductors are disposed in the element body can be identified from an appearance of the electronic component (element body).

In the one aspect, the second length may be larger than the first length. This configuration stabilizes a position of the electronic component when the electronic component is mounted on the electronic device.

In the one aspect, when viewed from the third direction, a height of the conductive resin layer may be half or more of a height of the element body. This configuration reliably suppresses the occurrence of a crack in the element body.

In the one aspect, the plurality of internal conductors may be disposed in the first direction, and may be exposed to a corresponding end surface of the pair of end surfaces. The external electrode may include a sintered metal layer. In this case, the sintered metal layer is formed on the end surface to be connected to a corresponding internal conductor of the plurality of internal electrodes. In this configuration, the external electrode is favorably in contact with the internal conductor. Therefore, this configuration allows reliable electrical connection between the external electrode and the internal conductor.

For example, in a case in which the electronic component is a multilayer capacitor, capacity of the multilayer capacitor can be increased even in a case in which the number of the internal conductors, that is, the number of the internal electrodes is small.

In the one aspect, the first length may be larger than the second length. This configuration enables high-density mounting of the electronic component.

In the one aspect, when viewed from the third direction, a height of the conductive resin layer may be not more than half of a height of the element body. A path through which moisture penetrates is further reduced in the present configuration, and thus moisture resistance reliability is further improved. This configuration suppresses an increase in equivalent series resistance (ESR), even in a case in which the external electrode includes the conductive resin layer.

In the one aspect, the plurality of internal conductors may be disposed in the second direction, and may be exposed to a corresponding end surface of the pair of end surfaces. The external electrode may include a sintered metal layer. In this case, the sintered metal layer is formed on the end surface to be connected to a corresponding internal conductor of the plurality of internal conductors. This configuration allows reliable electrical connection between the external electrode and the internal conductor, as described above.

For example, in a case in which the electronic component is the multilayer capacitor, a current path formed for each internal electrode (internal conductor) is short in this configuration. Therefore, this configuration has low equivalent series inductance (ESL).

In the one aspect, the sintered metal layer may include a first region covered with the conductive resin layer and a second region exposed from the conductive resin layer. The conductive resin layer includes, for example, a conductive material and a resin. The conductive material includes, for example, metal powder. The resin includes, for example, a thermosetting resin. Electric resistance of the conductive resin layer is larger than electric resistance of the sintered metal layer. In a case in which the sintered metal layer includes the second region, the second region is electrically connected to the electronic device without passing through the conductive resin layer. Therefore, this configuration suppresses an increase in ESR, even in a case in which the external electrode includes the conductive resin layer.

In the one aspect, the sintered metal layer may be formed on a first ridge portion positioned between the end surface and the side surface and on a second ridge portion positioned between the end surface and the first principal surface. The bonding strength between the conductive resin layer and the element body is smaller than the bonding strength between the conductive resin layer and the sintered metal layer. Therefore, the conductive resin layer may peel off from the element body. In this configuration, the sintered metal layer is formed on the first ridge portion and the second ridge portion. Therefore, even in a case in which the conductive resin layer peels off from the element body, the peel-off of the conductive resin layer tends not to develop to a position corresponding to the end surface beyond positions corresponding to the first ridge portion and the second ridge portion.

In the one aspect, the conductive resin layer may cover one part of a portion of the sintered metal layer formed on the first ridge portion and an entire portion of the sintered metal layer formed on the second ridge portion. In this configuration, the peel-off of the conductive resin layer further tends not to develop to the position corresponding to the end surface.

In the one aspect, the one part of the portion of the sintered metal layer formed on the first ridge portion may be exposed from the conductive resin layer. This configuration further suppresses the increase in ESR.

In the one aspect, the external electrode may include a plating layer covering the conductive resin layer and the second region of the sintered metal layer. In this configuration, the external electrode includes the plating layer, and thus the electronic component can be solder-mounting on the electronic device. The second region of the sintered metal layer is electrically connected to the electronic device via the plating layer. Therefore, this configuration further suppresses the increase in the ESR.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
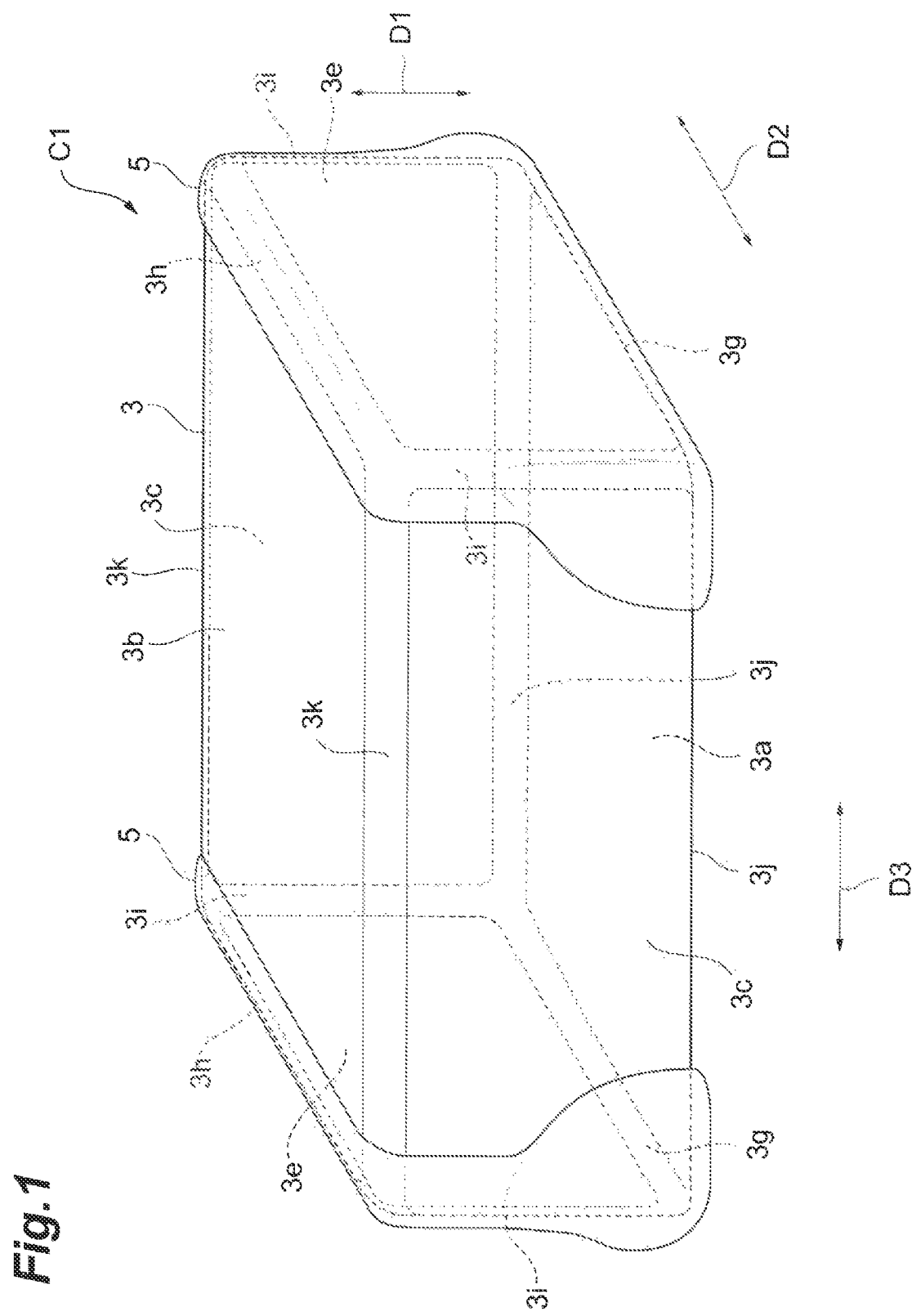
FIG. 1 is a perspective view of a multilayer capacitor according to a first embodiment.

Hereinafter, embodiments of the present invention will be described in detail with reference to the accompanying drawings. In the following description, the same elements or elements having the same functions are denoted with the same reference numerals and overlapped explanation is omitted.

First Embodiment

Figure 2:
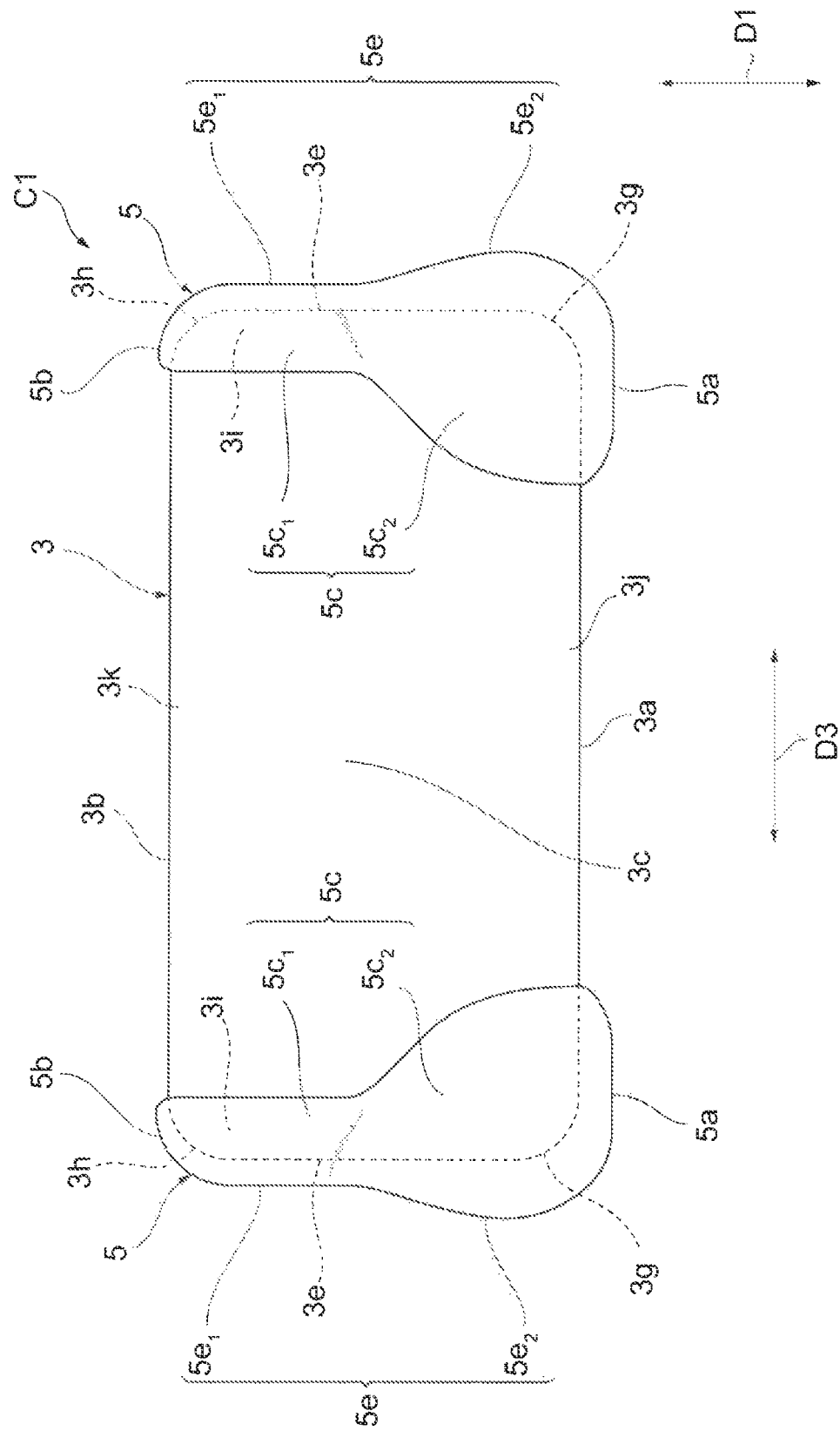
FIG. 2 is a side view of the multilayer capacitor according to the first embodiment.
Figure 3:
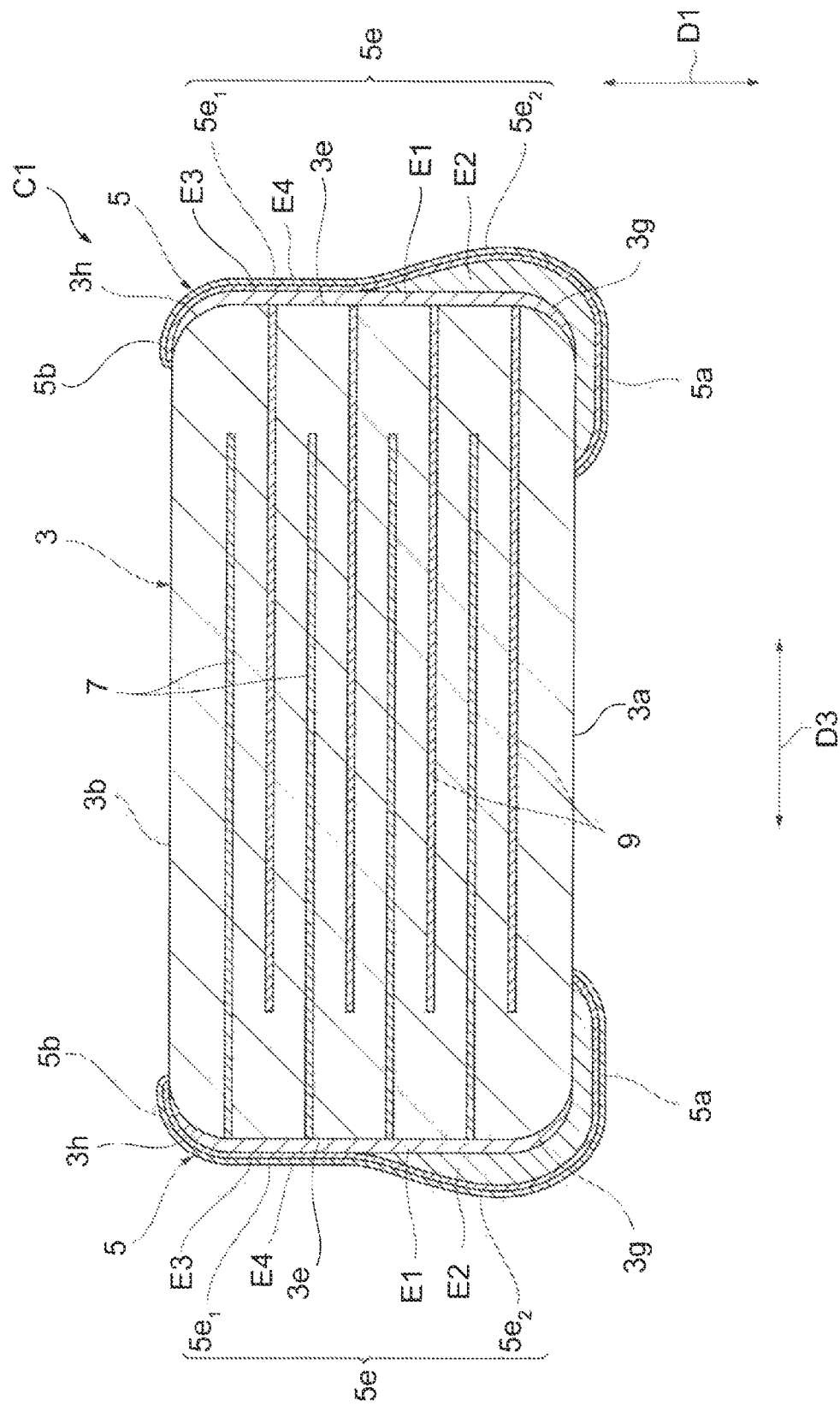
FIG. 3 is a view illustrating a cross-sectional configuration of the multilayer capacitor according to the first embodiment.
Figure 4:
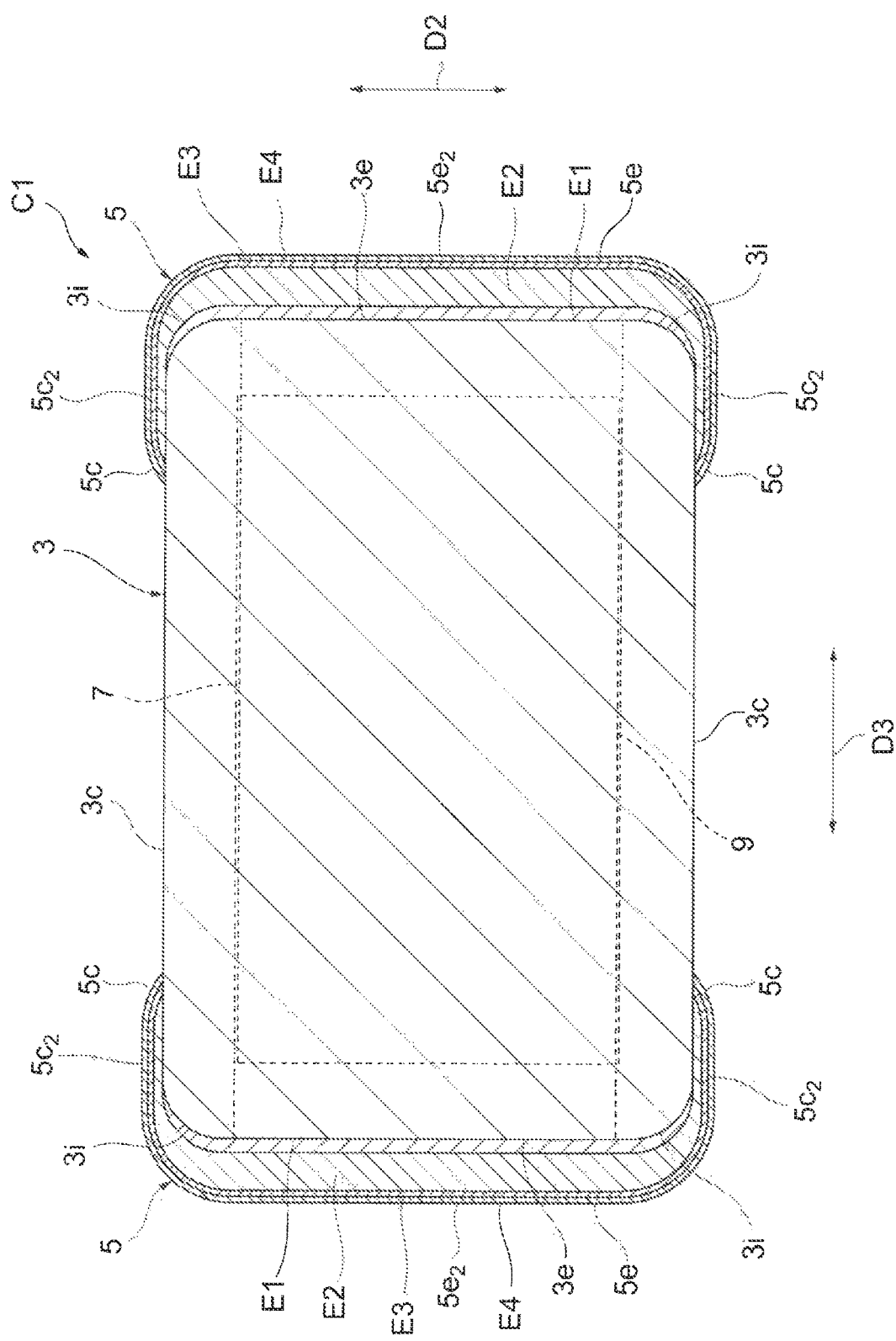
FIG. 4 is a view illustrating the cross-sectional configuration of the multilayer capacitor according to the first embodiment.
Figure 5:
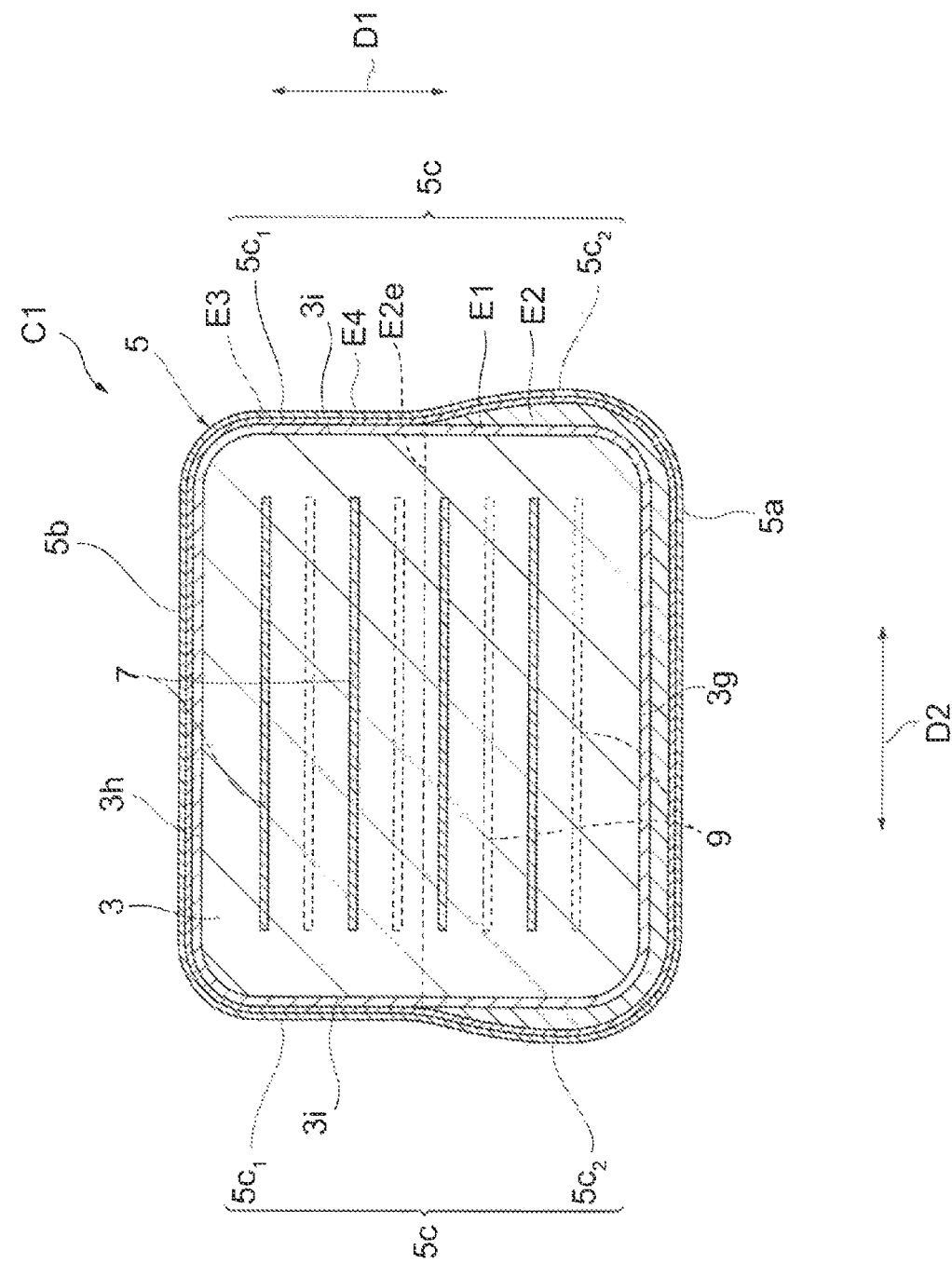
FIG. 5 is a view illustrating the cross-sectional configuration of the multilayer capacitor according to the first embodiment.
Figure 6:
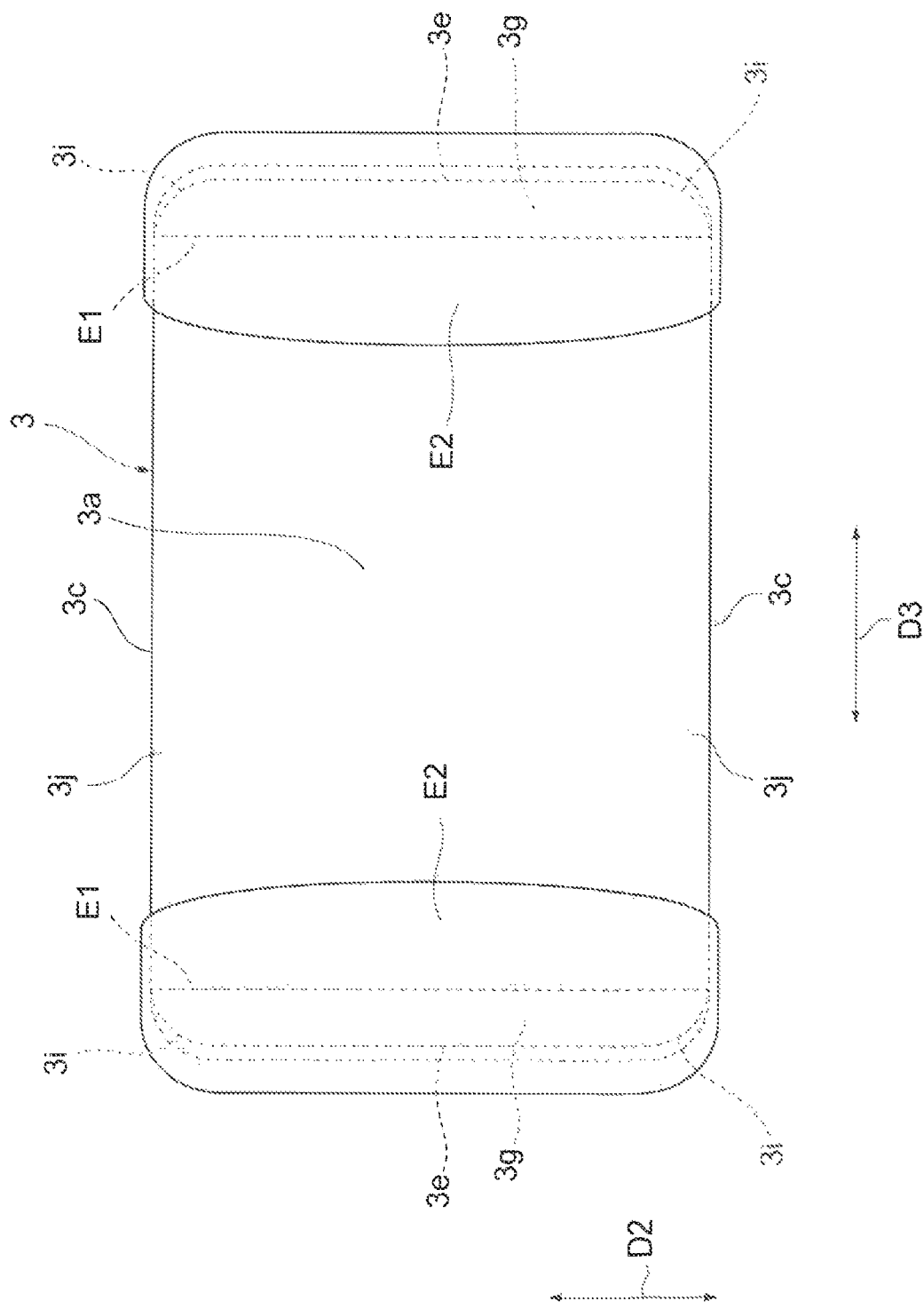
FIG. 6 is a plan view illustrating an element body, a first electrode layer, and a second electrode layer.
Figure 7:
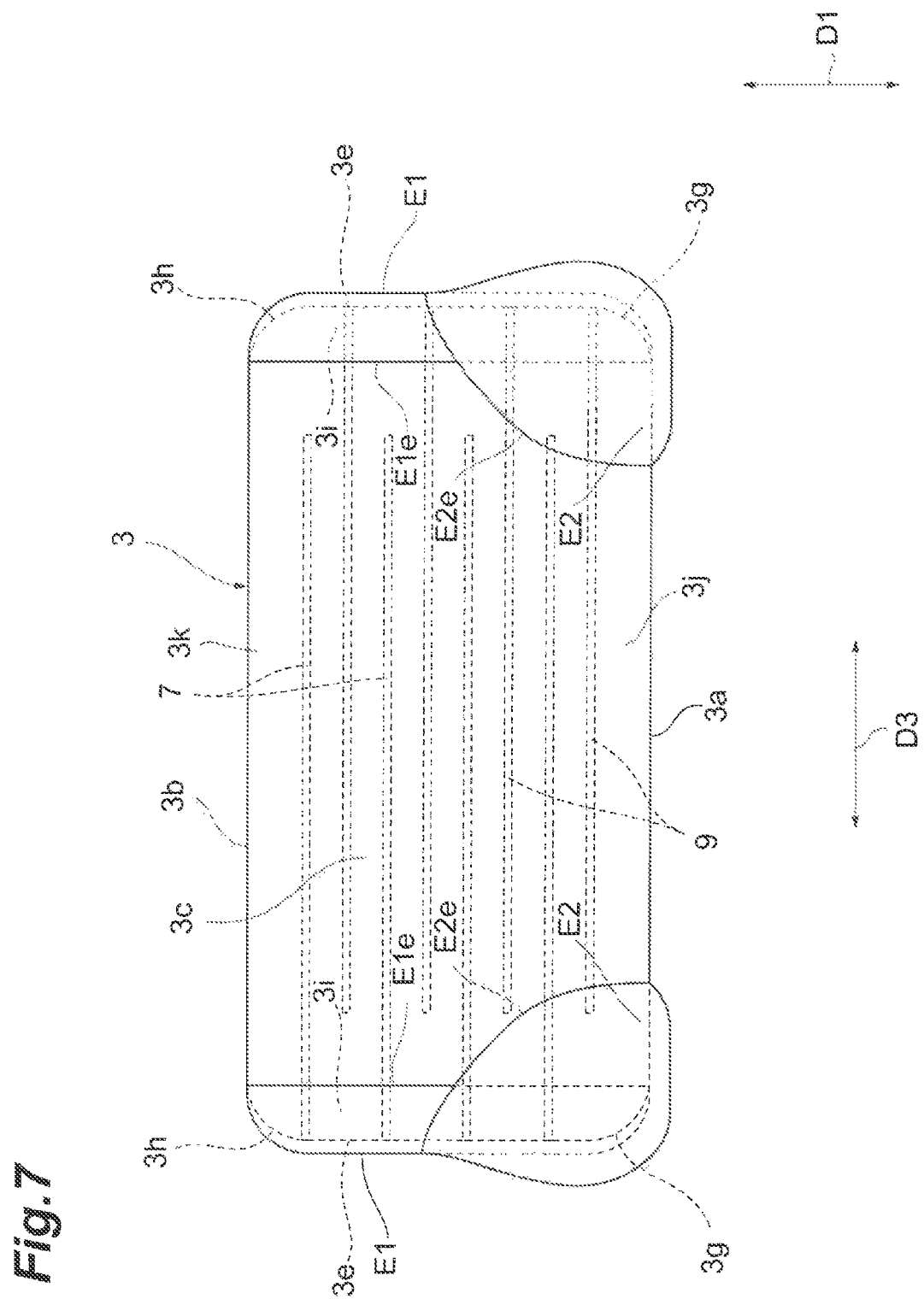
FIG. 7 is a side view illustrating the element body, the first electrode layer, and the second electrode layer.
Figure 8:
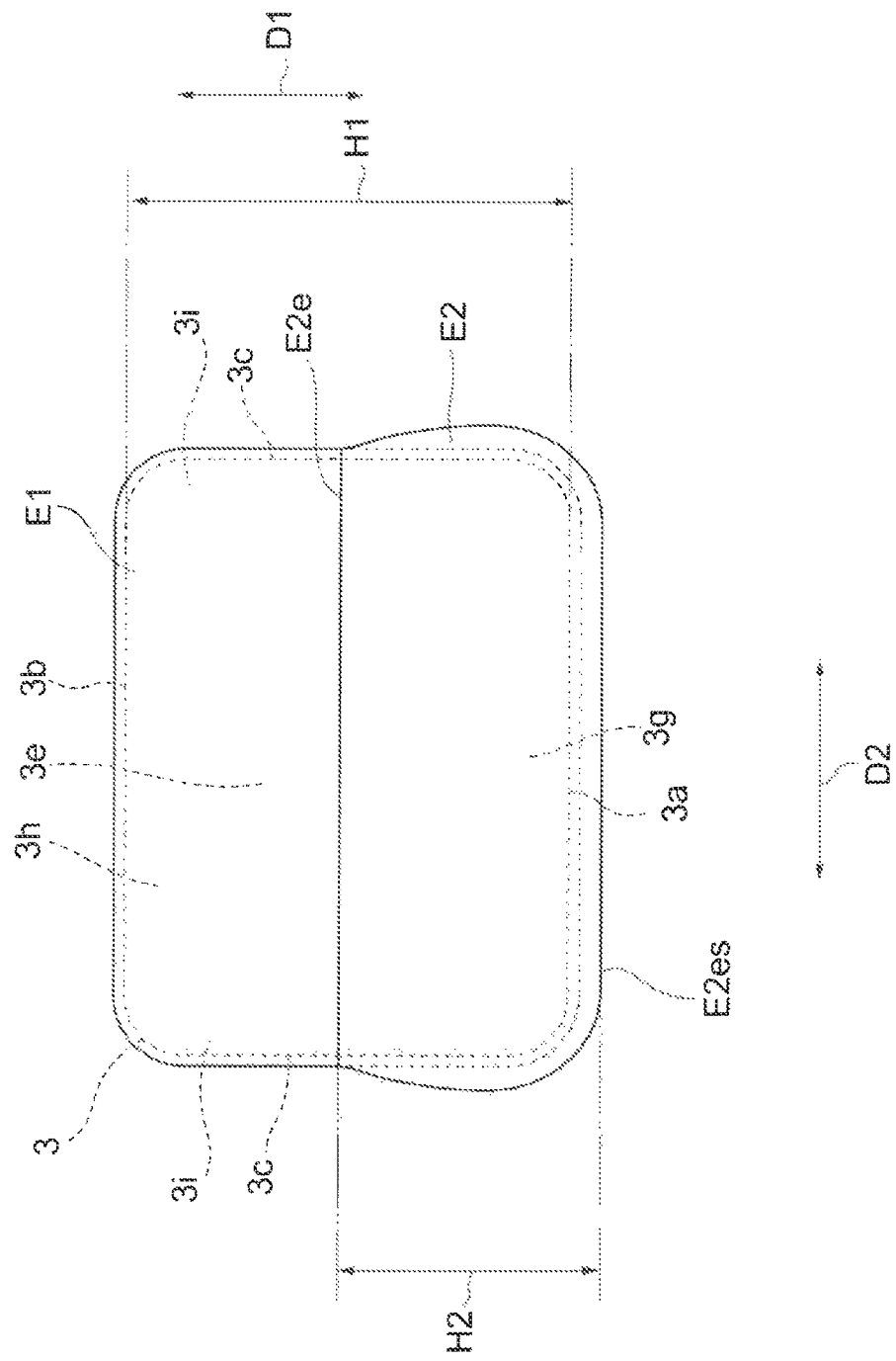
FIG. 8 is an end view illustrating the element body, the first electrode layer, and the second electrode layer.

A configuration of a multilayer capacitor C1 according to a first embodiment will be described with reference to FIGS. 1 to 8. FIG. 1 is a perspective view of the multilayer capacitor according to the first embodiment. FIG. 2 is a side view of the multilayer capacitor according to the first embodiment. FIGS. 3 to 5 are views illustrating a cross-sectional configuration of the multilayer capacitor according to the first embodiment. FIG. 6 is a plan view illustrating an element body, a first electrode layer, and a second electrode layer. FIG. 7 is a side view illustrating the element body, the first electrode layer, and the second electrode layer. FIG. 8 is an end view illustrating the element body, the first electrode layer, and the second electrode layer. In the first embodiment, an electronic component is, for example, the multilayer capacitor C1.

As illustrated in FIG. 1, the multilayer capacitor C1 includes an element body 3 of a rectangular parallelepiped shape and a plurality of external electrodes 5. In the present embodiment, the multilayer capacitor C1 includes a pair of external electrodes 5. The pair of external electrodes 5 is disposed on an outer surface of the element body 3. The pair of external electrodes 5 is separated from each other. The rectangular parallelepiped shape includes a rectangular parallelepiped shape in which corners and ridges are chamfered, and a rectangular parallelepiped shape in which the corners and ridges are rounded.

The element body 3 includes a pair of principal surfaces 3a and 3b opposing each other, a pair of side surfaces 3c opposing each other, and a pair of end surfaces 3e opposing each other. The pair of principal surfaces 3a and 3b, the pair of side surfaces 3c, and the pair of the end surface 3e have a rectangular shape. The direction in which the pair of principal surfaces 3a and 3b opposes each other is a first direction D1. The direction in which the pair of side surfaces 3c opposes each other is a second direction D2. The direction in which the pair of end surfaces 3e opposes each other is a third direction D3. The multilayer capacitor C1 is solder-mounted on an electronic device. The electronic device includes, for example, a circuit board or an electronic component. The principal surface 3a of the multilayer capacitor C1 opposes the electronic device. The principal surface 3a is arranged to constitute a mounting surface. The principal surface 3a is the mounting surface.

The first direction D1 is a direction orthogonal to the respective principal surfaces 3a and 3b and is orthogonal to the second direction D2. The third direction D3 is a direction parallel to the respective principal surfaces 3a and 3b and the respective side surfaces 3c, and is orthogonal to the first direction D1 and the second direction D2. The second direction D2 is a direction orthogonal to the respective side surfaces 3c. The third direction D3 is a direction orthogonal to the respective end surfaces 3e. In the first embodiment, a length of the element body 3 in the second direction D2 is larger than a length of the element body 3 in the first direction D1. A length of the element body 3 in the third direction D3 is larger than the length of the element body 3 in the first direction D1, and larger than the length of the element body 3 in the second direction D2. The third direction D3 is a longitudinal direction of the element body 3.

The pair of side surfaces 3c extends in the first direction D1 to couple the pair of principal surfaces 3a and 3b. The pair of side surfaces 3c also extends in the third direction D3. The pair of end surfaces 3e extends in the first direction D1 to couple the pair of principal surfaces 3a and 3b. The pair of end surfaces 3e also extends in the second direction D2.

The element body 3 includes a pair of ridge portions 3g, a pair of ridge portions 3h, four ridge portions 3i, a pair of ridge portions 3j, and a pair of ridge portions 3k. The ridge portion 3g is located between the end surface 3e and the principal surface 3a. The ridge portion 3h is located between the end surface 3e and the principal surface 3b. The ridge portion 3i is located between the end surface 3e and the side surface 3c. The ridge portion 3j is located between the principal surface 3a and the side surface 3c. The ridge portion 3k is located between the principal surface 3b and the side surface 3c. In the present embodiment, each of the ridge portions 3g, 3h, 3i, 3j, and 3k is rounded to curve. The element body 3 is subject to what is called a round chamfering process.

The end surface 3e and the principal surface 3a are indirectly adjacent to each other with the ridge portion 3g between the end surface 3e and the principal surface 3a. The end surface 3e and the principal surface 3b are indirectly adjacent to each other with the ridge portion 3h between the end surface 3e and the principal surface 3b. The end surface 3e and the side surface 3c are indirectly adjacent to each other with the ridge portion 3i between the end surface 3e and the side surface 3c. The principal surface 3a and the side surface 3c are indirectly adjacent to each other with the ridge portion 3j between the principal surface 3a and the side surface 3c. The principal surface 3b and the side surface 3c are indirectly adjacent to each other with the ridge portion 3k between the principal surface 3b and the side surface 3c.

The element body 3 is configured by laminating a plurality of dielectric layers in the first direction D1. The element body 3 includes the plurality of laminated dielectric layers. In the element body 3, a lamination direction of the plurality of dielectric layers coincides with the first direction D1. Each dielectric layer includes, for example, a sintered body of a ceramic green sheet containing a dielectric material. The dielectric material includes, for example, a dielectric ceramic of $BaTiO_3$ base, $Ba(Ti,Zr)O_3$ base, or $(Ba,Ca)TiO_3$ base. In an actual element body 3, each of the dielectric layers is integrated to such an extent that a boundary between the dielectric layers cannot be visually recognized. In the element body 3, the lamination direction of the plurality of dielectric layers may coincide with the second direction D2.

As illustrated in FIGS. 3 to 5, the multilayer capacitor C1 includes a plurality of internal electrodes 7 and a plurality of internal electrodes 9. Each of the internal electrodes 7 and 9 is an internal conductor disposed in the element body 3. Each of the internal electrodes 7 and 9 is made of a conductive material that is commonly used as an internal conductor of a multilayer electronic component. The conductive material includes, for example, a base metal. The conductive material includes, for example, Ni or Cu. Each of the internal electrodes 7 and 9 is configured as a sintered body of conductive paste containing the conductive material described above. In the first embodiment, the internal electrodes 7 and 9 are made of Ni.

The internal electrodes 7 and the internal electrodes 9 are disposed in different positions (layers) in the first direction D1. The internal electrodes 7 and the internal electrodes 9 are alternately disposed in the element body 3 to oppose each other in the first direction D1 with an interval therebetween. Polarities of the internal electrodes 7 and the internal electrodes 9 are different from each other. In a case in which the lamination direction of the plurality of dielectric layers is the second direction D2, the internal electrodes 7 and the internal electrodes 9 are disposed in different positions (layers) in the second direction D2. One end of each of the internal electrodes 7 and 9 is exposed to a corresponding end surface 3e of the pair of the end surfaces 3e. Each of the internal electrodes 7 and 9 includes one end exposed to the corresponding end surface 3e. In the multilayer capacitor C1, a predetermined direction in which the internal electrodes 7 and 9 are disposed is the first direction D1.

The plurality of internal electrodes 7 and the plurality of internal electrodes 9 are alternately disposed in the first direction D1. The internal electrodes 7 and 9 are located in a plane approximately parallel to the principal surfaces 3a and 3b. The internal electrodes 7 and the internal electrodes 9 oppose each other in the first direction D1. The direction (first direction D1) in which the internal electrodes 7 and the internal electrodes 9 oppose each other is orthogonal to the direction (second direction D2 or third direction D3) parallel to the principal surfaces 3a and 3b.

In a case in which the lamination direction of the plurality of dielectric layers coincides with the second direction D2, the plurality of internal electrodes 7 and the plurality of internal electrodes 9 are alternately disposed in the second direction D2. In this case, the internal electrodes 7 and 9 are located in a plane approximately orthogonal to the principal surfaces 3a and 3b. The internal electrodes 7 and the internal electrodes 9 oppose each other in the second direction D2.

As illustrated in FIG. 2, the external electrodes 5 are disposed at both end portions of the element body 3 in the third direction D3. Each of the external electrodes 5 is disposed on the corresponding end surface 3e side of the element body 3. As illustrated in FIGS. 3 to 5, the external electrode 5 includes a plurality of electrode portions 5a, 5b, 5c, and 5e. The electrode portion 5a is disposed on the principal surface 3a and the ridge portion 3g. The electrode portion 5b is disposed on the ridge portion 3h. The electrode portion 5c is disposed on each side surface 3c and each ridge portion 3i. The electrode portion 5e is disposed on the corresponding end surface 3e. The external electrode 5 also includes electrode portions disposed on the ridge portion 3j.

The external electrode 5 is formed on the four surfaces, that is, the principal surface 3a, the end surface 3e, and the pair of side surfaces 3c, as well as on the ridge portions 3g, 3h, 3i, and 3j. The electrode portions 5a, 5b, 5c, and 5e adjacent each other are coupled and are electrically connected to each other. In the present embodiment, the external electrode 5 is not intentionally formed on the principal surface 3b. Each electrode portion 5e covers all one ends of the corresponding internal electrodes 7 or 9. The electrode portion 5e is directly connected to the corresponding internal electrodes 7 or 9. The external electrode 5 is electrically connected to the corresponding internal electrodes 7 or 9.

As illustrated in FIGS. 3 to 5, the external electrode 5 includes a first electrode layer E1, a second electrode layers E2, a third electrode layer E3, and a fourth electrode layer E4. The fourth electrode layer E4 is arranged to constitute the outermost layer of the external electrode 5. Each of the electrode portions 5a, 5c, and 5e includes the first electrode layer E1, the second electrode layer E2, the third electrode layer E3, and the fourth electrode layer E4. The electrode portion 5b includes the first electrode layer E1, the third electrode layer E3, and the fourth electrode layer E4.

The first electrode layer E1 included in the electrode portion 5a is disposed on the ridge portion 3g, and is not disposed on the principal surface 3a. The first electrode layer E1 included in the electrode portion 5a is in contact with the entire ridge portion 3g. The principal surface 3a is not covered with the first electrode layer E1, and is exposed from the first electrode layer E1. The second electrode layer E2 included in the electrode portion 5a is disposed on the first electrode layer E1 and the principal surface 3a. The first electrode layer E1 included in the electrode portion 5a is entirely covered with the second electrode layer E2. The second electrode layer E2 included in the electrode portion 5a is in contact with one part of the principal surface 3a and the entire first electrode layer E1. The one part of the principal surface 3a is, for example, the partial region near the end surface 3e, in the principal surface 3a. That is, the one part of the principal surface 3a is close to the end surface 3e. The electrode portion 5a is four-layered on the ridge portion 3g, and is three-layered on the principal surface 3a.

As described above, in a case in which an element is described as covering another element, the element may directly cover the other element or indirectly cover the other element. In a case in which an element is described as indirectly covering another element, an intervening element is present between the element and the other element. In a case in which an element is described as directly covering another element, no intervening element is present between the element and the other element.

The second electrode layer E2 included in the electrode portion 5a is formed to cover the entire ridge portion 3g and the one part of the principal surface 3a. The one part of the principal surface 3a is, for example, the partial region near the end surface 3e, in the principal surface 3a. That is, the one part of the principal surface 3a is close to the end surface 3e. The second electrode layer E2 included in the electrode portion 5a indirectly covers the entire ridge portion 3g in such a manner that the first electrode layer E1 is located between the second electrode layer E2 and the ridge portion 3g. The second electrode layer E2 included in the electrode portion 5a directly covers the one part of the principal surface 3a. The second electrode layer E2 included in the electrode portion 5a directly covers an entire portion of the first electrode layer E1 formed on the ridge portion 3g.

The first electrode layer E1 included in the electrode portion 5b is disposed on the ridge portion 3h, and is not disposed on the principal surface 3b. The first electrode layer E1 included in the electrode portion 5b is in contact with the entire ridge portion 3h. The principal surface 3b is not covered with the first electrode layer E1, and is exposed from the first electrode layer E1. The electrode portion 5b does not include the second electrode layer E2. The principal surface 3b is not covered with the second electrode layer E2, and is exposed from the second electrode layer E2. The second electrode layer E2 is not formed on the principal surface 3b. The electrode portion 5b is three-layered.

The first electrode layer E1 included in the electrode portion 5c is disposed on the ridge portion 3i, and is not disposed on the side surface 3c. The first electrode layer E1 included in the electrode portion 5c is in contact with the entire ridge portion 3i. The side surface 3c is not covered with the first electrode layer E1, and is exposed from the first electrode layer E1. The second electrode layer E2 included in the electrode portion 5c is disposed on the first electrode layer E1 and the side surface 3c. One part of the first electrode layer E1 is covered with the second electrode layer E2. The second electrode layer E2 included in the electrode portion 5c is in contact with one part of the side surface 3c and the one part of the first electrode layer E1. The second electrode layer E2 included in the electrode portion 5c includes a portion located on the side surface 3c.

The second electrode layer E2 included in the electrode portion 5c is formed to cover one part of the ridge portion 3i and one part of the side surface 3c. The one part of the ridge portion 3i is, for example, a partial region near the principal surface 3a, in the ridge portion 3i. That is, the one part of the ridge portion 3i is close to the principal surface 3a. The one part of the side surface 3c is, for example, a corner region near the principal surface 3a and end surface 3e, in the side surface 3c. That is, the one part of the side surface 3c is close to the principal surface 3a and end surface 3e. The second electrode layer E2 included in the electrode portion 5c indirectly covers the one part of the ridge portion 3i in such a manner that the first electrode layer E1 is located between the second electrode layer E2 and the ridge portion 3i. The second electrode layer E2 included in the electrode portion 5c directly covers the one part of the side surface 3c. The second electrode layer E2 included in the electrode portion 5c directly covers one part of the portion of the first electrode layer E1 formed on the ridge portion 3i.

The electrode portion 5c includes a plurality of regions $5c_1$ and $5c_2$. In the present embodiment, the electrode portion 5c includes only two regions $5c_1$ and $5c_2$. The region $5c_2$ is located closer to the principal surface 3a than the region $5c_1$. The region $5c_1$ includes the first electrode layer E1, the third electrode layer E3, and the fourth electrode layer E4. The region $5c_1$ does not include the second electrode layer E2. The region $5c_1$ is three-layered. The region $5c_2$ includes the first electrode layer E1, the second electrode layer E2, the third electrode layer E3, and the fourth electrode layer E4. The regions $5c_2$ is four-layered on the ridge portion 3i, and is three-layered on the side surface 3c. The region $5c_1$ is the region where the first electrode layer E1 is exposed from the second electrode layer E2. The region $5c_2$ is the region where the first electrode layer E1 is covered with the second electrode layer E2.

The first electrode layer E1 included in the electrode portion 5e is disposed on the end surface 3e. The end surface 3e is entirely covered with the first electrode layer E1. The first electrode layer E1 included in the electrode portion 5e is in contact with the entire end surface 3e. The second electrode layer E2 included in the electrode portion 5e is disposed on the first electrode layer E1. The first electrode layer E1 is partially covered with the second electrode layer E2. The second electrode layer E2 included in the electrode portion 5e is in contact with one part of the first electrode layer E1. The second electrode layer E2 included in the electrode portion 5e is formed to cover one part of the end surface 3e. The one part of the end surface 3e is, for example, a partial region near the principal surface 3a, in the end surface 3e. That is, the one part of the end surface 3e is close to the principal surface 3a. The second electrode layer E2 included in the electrode portion 5e indirectly covers the one part of the end surface 3e in such a manner that the first electrode layer E1 is located between the second electrode layer E2 and the end surface 3e. The second electrode layer E2 included in the electrode portion 5e directly covers one part of the portion of the first electrode layer E1 formed on the end surface 3e. The first electrode layer E1 included in the electrode portion 5e is formed on the end surface 3e to be coupled to the one ends of the corresponding internal electrodes 7 or 9.

The electrode portion 5e includes a plurality of regions $5e_1$ and $5e_2$. In the present embodiment, the electrode portion 5e includes only two regions $5e_1$ and $5e_2$. The region $5e_2$ is located closer to the principal surface 3a than the region $5e_1$. The region $5e_1$ includes the first electrode layer E1, the third electrode layer E3, and the fourth electrode layer E4. The region $5e_1$ does not include the second electrode layer E2. The region $5e_1$ is three-layered. The region $5e_2$ includes the first electrode layer E1, the second electrode layer $E2_1$, the third electrode layer E3, and the fourth electrode layer E4. The regions $5e_2$ is four-layered. The region $5e_1$ is the region where the first electrode layer E1 is exposed from the second electrode layer E2. The region $5e_2$ is the region where the first electrode layer E1 is covered with the second electrode layer E2.

The first electrode layer E1 is formed by sintering conductive paste applied onto the surface of the element body 3. The first electrode layer E1 is formed to cover the end surface 3e and the ridge portions 3g, 3h, and 3i. The first electrode layer E1 is formed by sintering a metal component (metal powder) contained in the conductive paste. The first electrode layer E1 includes a sintered metal layer. The first electrode layer E1 includes a sintered metal layer formed on the element body 3. The first electrode layer E1 is not intentionally formed on the pair of principal surfaces 3a and 3b and the pair of side surfaces 3c. The first electrode layer E1 may be unintentionally formed on the principal surfaces 3a and 3b and the side surfaces 3c due to a production error, for example. In the present embodiment, the first electrode layer E1 is a sintered metal layer made of Cu. The first electrode layer E1 may be a sintered metal layer made of Ni. The first electrode layer E1 contains a base metal. The conductive paste contains, for example, powder made of Cu or Ni, a glass component, an organic binder, and an organic solvent. The first electrode layer E1 included in the electrode portion 5a, the first electrode layer E1 included in the electrode portion 5b, the first electrode layer E1 included in the electrode portion 5c, and the first electrode layer E1 included in the electrode portion 5e are integrally formed.

The second electrode layer E2 is formed by curing conductive resin applied onto the first electrode layer E1, the principal surface 3a, and the pair of side surfaces 3c. The second electrode layer E2 is formed over the first electrode layer E1 and the element body 3. The first electrode layer E1 serves as an underlying metal layer for forming the second electrode layer E2. The second electrode layer E2 is a conductive resin layers formed on the first electrode layer E1. The conductive resin contains, for example, a resin, a conductive material, and an organic solvent. The resin is, for example, a thermosetting resin. The conductive material is, for example, metal powder. The metal powder is, for example, Ag powder or Cu powder. The thermosetting resin is, for example, a phenolic resin, an acrylic resin, a silicone resin, an epoxy resin, or a polyimide resin.

In the present embodiment, the second electrode layer E2 covers one part of the first electrode layer E1. The one part of the first electrode layer E1 is, for example, the regions corresponding to the electrode portion 5a, the region $5c_2$ of the electrode portion 5c, and the region $5e_2$ of the electrode portion 5e, in the first electrode layer E1. The second electrode layer E2 directly covers one part of the ridge portion 3j. The one part of the ridge portion 3j is, for example, a partial region near the end surface 3e, in the ridge portion 3j. That is, the one part of the ridge portion 3j is close to the end surface 3e. The second electrode layer E2 is in contact with the one part of the ridge portion 3j. The second electrode layer E2 included in the electrode portion 5a, the second electrode layer E2 included in the electrode portion 5c, and the second electrode layer E2 included in the electrode portion 5e are integrally formed.

The third electrode layer E3 is formed on the second electrode layer E2 and the first electrode layer E1 by plating method. The third electrode layer E3 is formed on a portion of the first electrode layer E1 exposed from the second electrode layer E2. In the present embodiment, the third electrode layer E3 is formed on the first electrode layer E1 and the second electrode layer E2 by Ni plating. The third electrode layer E3 is a Ni plating layer. The third electrode layer E3 may be an Sn plating layer, a Cu plating layer, or an Au plating layer. The third electrode layer E3 contains Ni, Sn, Cu, or Au. The fourth electrode layer E4 is formed on the third electrode layer E3 by plating method. In the present embodiment, the fourth electrode layer E4 is formed on the third electrode layer E3 by Sn plating. The fourth electrode layer E4 is an Sn plating layer. The fourth electrode layer E4 may be a Cu plating layer or an Au plating layer. The fourth electrode layer E4 contains Sn, Cu, or Au. The third electrode layer E3 and the fourth electrode layer E4 constitute a plating layer formed on the second electrode layer E2. In the present embodiment, the plating layer formed on the second electrode layer E2 is two-layered. The third electrode layer E3 included in the electrode portion 5a, the third electrode layer E3 included in the electrode portion 5b, the third electrode layer E3 included in the electrode portion 5c, and the third electrode layer E3 included in the electrode portion 5e are integrally formed. The fourth electrode layer E4 included in the electrode portion 5a, the fourth electrode layer E4 included in the electrode portion 5b, the fourth electrode layer E4 included in the electrode portion 5c, and the fourth electrode layer E4 included in the electrode portion 5e are integrally formed.

The first electrode layer E1 (first electrode layer E1 included in the electrode portion 5e) is formed on the end surface 3e to be connected to the corresponding internal electrodes 7 and 9. The first electrode layer E1 covers the entire end surface 3e, the entire ridge portion 3g, the entire ridge portion 3h, and the entire ridge portion 3i. The second electrode layer E2 (second electrode layer E2 included in the electrode portions 5a, 5c, and 5e) continuously covers one part of the principal surface 3a, one part of the end surface 3e, and one part of each of the pair of side surfaces 3c. The second electrode layer E2 (second electrode layer E2 included in the electrode portions 5a, 5c, and 5e) covers the entire ridge portion 3g, one part of the ridge portion 3i, and one part of the ridge portion 3j. The second electrode layer E2 includes a plurality of portions each corresponding to the one part of the principal surface 3a, the one part of the end surface 3e, the one part of each of the pair of side surfaces 3c, the entire ridge portion 3g, the one part of the ridge portion 3i, and the one part of the ridge portion 3j. The first electrode layer E1 (first electrode layer E1 included in the electrode portion 5e) is directly connected to the corresponding internal electrodes 7 and 9.

The first electrode layer E1 (first electrode layer E1 included in the electrode portions 5a, 5b, 5c, and 5e) includes a region covered with the second electrode layer E2 (second electrode layer E2 included in the electrode portions 5a, 5c, and 5e), and a region not covered with the second electrode layer E2 (second electrode layer E2 included in the electrode portions 5a, 5c, and 5e). The region not covered with the second electrode layer E2 is a region exposed from the second electrode layers layer E2. The third electrode layer E3 and the fourth electrode layer E4 cover the region on the first electrode layer E1 not covered with the second electrode layer E2 and the second electrode layer E2.

As illustrated in FIG. 6, when viewed from the first direction D1, the first electrode layer E1 (first electrode layer E1 included in the electrode portion 5a) is entirely covered with the second electrode layer E2. When viewed from the first direction D1, the first electrode layer E1 (first electrode layer E1 included in the electrode portion 5a) is not exposed from the second electrode layer E2.

As illustrated in FIG. 7, when viewed from the second direction D2, an end region near the principal surface 3a of the first electrode layer E1 is covered with the second electrode layer E2. The end region near the principal surface 3a of the first electrode layer E1 includes the first electrode layer E1 included in the region $5c_2$. The end region of the first electrode layer E1 is close to the principal surface 3a. When viewed from the second direction D2, an end edge E2e of the second electrode layer E2 crosses an end edge E1e of the first electrode layer E1. When viewed from the second direction D2, an end region near the principal surface 3b of the first electrode layer E1 is exposed from the second electrode layer E2. The end region near the principal surface 3b of the first electrode layer E1 includes the first electrode layer E1 included in the region $5c_1$. The other end region of the first electrode layer E1 is close to the principal surface 3b. When viewed from the second direction D2, an area of the second electrode layer E2 located on the side surface 3c and the ridge portion 3i is larger than an area of the first electrode layer E1 located on the ridge portion 3i.

As illustrated in FIG. 8, when viewed from the third direction D3, the end region near the principal surface 3a of the first electrode layer E1 is covered with the second electrode layer E2. The end region near the principal surface 3a of the first electrode layer E1 includes the first electrode layer E1 included in the region $5e_2$. The end region of the first electrode layer E1 is close to the principal surface 3a. When viewed from the third direction D3, the end edge E2e of the second electrode layer E2 is located on the first electrode layer E1. When viewed from the third direction D3, the end region near the principal surface 3b of the first electrode layer E1 is exposed from the second electrode layer E2. The end region near the principal surface 3b of the first electrode layer E1 includes the first electrode layer E1 included in the region $5e_1$. The other end region of the first electrode layer E1 is close to the principal surface 3b. When viewed from the third direction D3, an area of the second electrode layer E2 positioned on the end surface 3e and the ridge portion 3g is smaller than an area of the first electrode layer E1 positioned on the end surface 3e and the ridge portion 3g.

When viewed from the third direction D3, a height H2 of the second electrode layer E2 is half or more of a height H1 of the element body 3. The height H2 of the second electrode layer E2 is, for example, an interval between an end edge E2es of the second electrode layer E2 and the end edge E2e of the second electrode layer E2 in the first direction D1 when viewed from the third direction D3. The end edge E2es is constituted by a surface of the second electrode layer E2 located on the principal surface 3a when viewed from the third direction D3.

In the present embodiment, the second electrode layer E2 continuously covers only the one part of the principal surface 3a, only the one part of the end surface 3e, and only the one part of each of the pair of side surfaces 3c. The second electrode layer $E2_1$ covers the entire ridge portion 3g, only the one part of the ridge portion 3i, and only the one part of the ridge portion 3j. The portion of the first electrode layer E1 covering the ridge portion 3i is partially exposed from the second electrode layer E2. For example, the first electrode layer E1 included in the region $5c_1$ is exposed from the second electrode layer E2.

As illustrated in FIG. 2, a width of the region $5c_2$ in the third direction D3 decreases with an increase in distance from the principal surface 3a. The width of the region $5c_2$ in the third direction D3 decreases with an increase in distance from the electrode portion 5a. A width of the region $5c_2$ in the first direction D1 decreases with an increase in distance from the end surface 3e. The width of the region $5c_2$ in the first direction D1 decreases with an increase in distance from the electrode portion 5e. In the present embodiment, when viewed from the second direction D2, an end edge of the region $5c_2$ has an approximately arc shape. When viewed from the second direction D2, the region $5c_2$ has an approximately fan shape. As illustrated in FIG. 7, in the present embodiment, a width of the second electrode layer E2 when viewed from the second direction D2 decreases with an increase in distance from the principal surface 3a.

When viewed from the second direction D2, a length of the second electrode layer E2 in the first direction D1 decreases with an increase in distance from the end surface 3e in the third direction D3. When viewed from the second direction D2, a length of the portion of the second electrode layers E2 located on the side surface 3c in the first direction D1 decreases with an increase in distance from an end portion of the element body 3 in the third direction D3. As illustrated in FIG. 7, when viewed from the second direction D2, the end edge E2e of the second electrode layer E2 has an approximately arc shape.

In a case in which the multilayer capacitor C1 is solder-mounted on an electronic device, external force applied onto the multilayer capacitor C1 from the electronic device may act as stress on the element body 3. The external force acts on the element body 3 from a solder fillet formed at a solder-mounting, through the external electrode 5. In this case, a crack may occur in the element body 3. The external force tends to act on a region defined by one part of the principal surface 3a, one part of the end surface 3e, and one part of each of the pair of side surfaces 3c, in the element body 3. In the multilayer capacitor C1, the second electrode layer E2 (second electrode layer E2 included in the electrode portions 5a, 5c, and 5e) continuously covers the one part of the principal surface 3a, the one part of the end surface 3e, and the one part of each of the pair of side surfaces 3c. Therefore, the external force applied onto the multilayer capacitor C1 from the electronic device tends not to act on the element body 3. Consequently, the multilayer capacitor C1 suppresses occurrence of a crack in the element body 3.

A region between the element body 3 and the second electrode layer E2 may include a path through which moisture infiltrates. In a case in which moisture infiltrates from the region between the element body 3 and the second electrode layer, durability of the multilayer capacitor C1 decreases. The multilayer capacitor C1 includes few paths through which moisture infiltrates, as compared with a multilayer capacitor in which the conductive resin layer covers the entire end surface 3e, the one part of each of the principal surfaces 3a and 3b, and the one part of each of the pair of side surfaces 3c. Consequently, the multilayer capacitor C1 improves moisture resistance reliability.

In the multilayer capacitor C1, the plurality of internal electrodes 7 and 9 is disposed in a predetermined direction of the first direction D1 and the second direction D2 in the element body 3. In the present embodiment, the plurality of internal electrodes 7 and the plurality of internal electrodes 9 are disposed in the first direction D1. In other words, in the multilayer capacitor C1, the predetermined direction in which each of the internal electrodes 7 and 9 is disposed is the first direction D1. The length of the element body 3 in the first direction D1 is different from the length of the element body 3 in the second direction D2. Therefore, the direction in which the plurality of internal electrodes 7 and 9 is disposed in the element body 3 can be identified from an appearance of the multilayer capacitor C1 (element body 3).

In the multilayer capacitor C1, the length of the element body 3 in the second direction D2 is larger than the length of the element body 3 in the first direction D1. Therefore, the multilayer capacitor C1 stabilizes a position of the multilayer capacitor C1 when the multilayer capacitor C1 is mounted on the electronic device.

In the multilayer capacitor C1, when viewed from the third direction D3, the height H2 of the second electrode layer E2 is half or more of the height H1 of the element body 3. Therefore, the multilayer capacitor C1 reliably suppresses the occurrence of a crack in the element body.

In the multilayer capacitor C1, the plurality of internal electrodes 7 and 9 is disposed in the first direction D1, and is exposed to the corresponding end surface 3e. The external electrode 5 includes the first electrode layer E1 (first electrode layer E1 included in the electrode portion 5e). The first electrode layer E1 is formed on the end surface 3e to be connected to the corresponding internal electrodes 7 and 9. In the multilayer capacitor C1, the external electrode 5 (first electrode layer E1) and the internal electrodes 7 and 9 that correspond to each other are favorably in contact with each other. Therefore, the multilayer capacitor C1 allows reliable electrical connection between the external electrode 5 and the internal electrodes 7 and 9 that correspond to each other.

In the multilayer capacitor C1, an area in which the internal electrode 7 and the internal electrode 9 oppose each other can be set relatively large. Therefore, capacity of the multilayer capacitor C1 can be increased even in a case in which the number of the internal electrodes 7 and 9 is small.

In the multilayer capacitor C1, the first electrode layer E1 (first electrode layer E1 included in the electrode portion 5e) includes the region covered with the second electrode layer E2 (second electrode layer E2 included in the electrode portion 5e) and the region exposed from the second electrode layer E2 (second electrode layer E2 included in the electrode portion 5e). Electric resistance of the second electrode layer E2 is larger than electric resistance of the first electrode layer E1. The region exposed from the second electrode layer E2 in the first electrode layer E1 is electrically connected to the electronic device without passing through the second electrode layer E2. Therefore, the multilayer capacitor C1 suppresses an increase in ESR even in a case in which the external electrode 5 includes the second electrode layer E2.

The bonding strength between the second electrode layer E2 and the element body 3 is smaller than the bonding strength between the second electrode layer E2 and the first electrode layer E1. Therefore, the second electrode layer E2 may peel off from the element body 3.

In the multilayer capacitor C1, the first electrode layer E1 covers the ridge portions 3g and 3i. Therefore, even in a case in which the second electrode layer E2 peels off from the element body 3, the peel-off of the second electrode layer E2 tends not to develop to a position corresponding to the end surface 3e beyond a position corresponding to the ridge portions 3g and 3i.

In the multilayer capacitor C1, the second electrode layer E2 (second electrode layer E2 included in the electrode portions 5a and 5c) is formed to cover the one part of the portion of the first electrode layer E1 formed on the ridge portion 3i and the entire portion of the first electrode layer E1 formed on the ridge portion 3g. The one part of the portion of the first electrode layer E1 formed on the ridge portion 3i includes, for example, the first electrode layer E1 in the region $5c_2$. Therefore, the peel-off of the second electrode layer E2 further tends not to develop to the position corresponding to the end surface 3e.

In the multilayer capacitor C1, the one part of the portion of the first electrode layer E1 formed on the ridge portion 3i is exposed from the second electrode layer E2. The one part of the portion of the first electrode layer E1 formed on the ridge portion 3i includes, for example, the first electrode layer E1 in the region $5c_1$. Therefore, the multilayer capacitor C1 further suppresses the increase in ESR.

In the multilayer capacitor C1, the external electrode 5 includes the third electrode layer E3 and fourth electrode layer E4. Therefore, the multilayer capacitor C1 can be solder-mounting on the electronic device.

The third electrode layer E3 and fourth electrode layer E4 cover the second electrode layer E2 and the region exposed from the second electrode layer E2 in the first electrode layer E1. The region exposed from the second electrode layer E2 in the first electrode layer E1 is electrically connected to the electronic device via the third electrode layer E3 and fourth electrode layer E4. Therefore, the multilayer capacitor C1 further suppresses the increase in the ESR.

Figure 9:
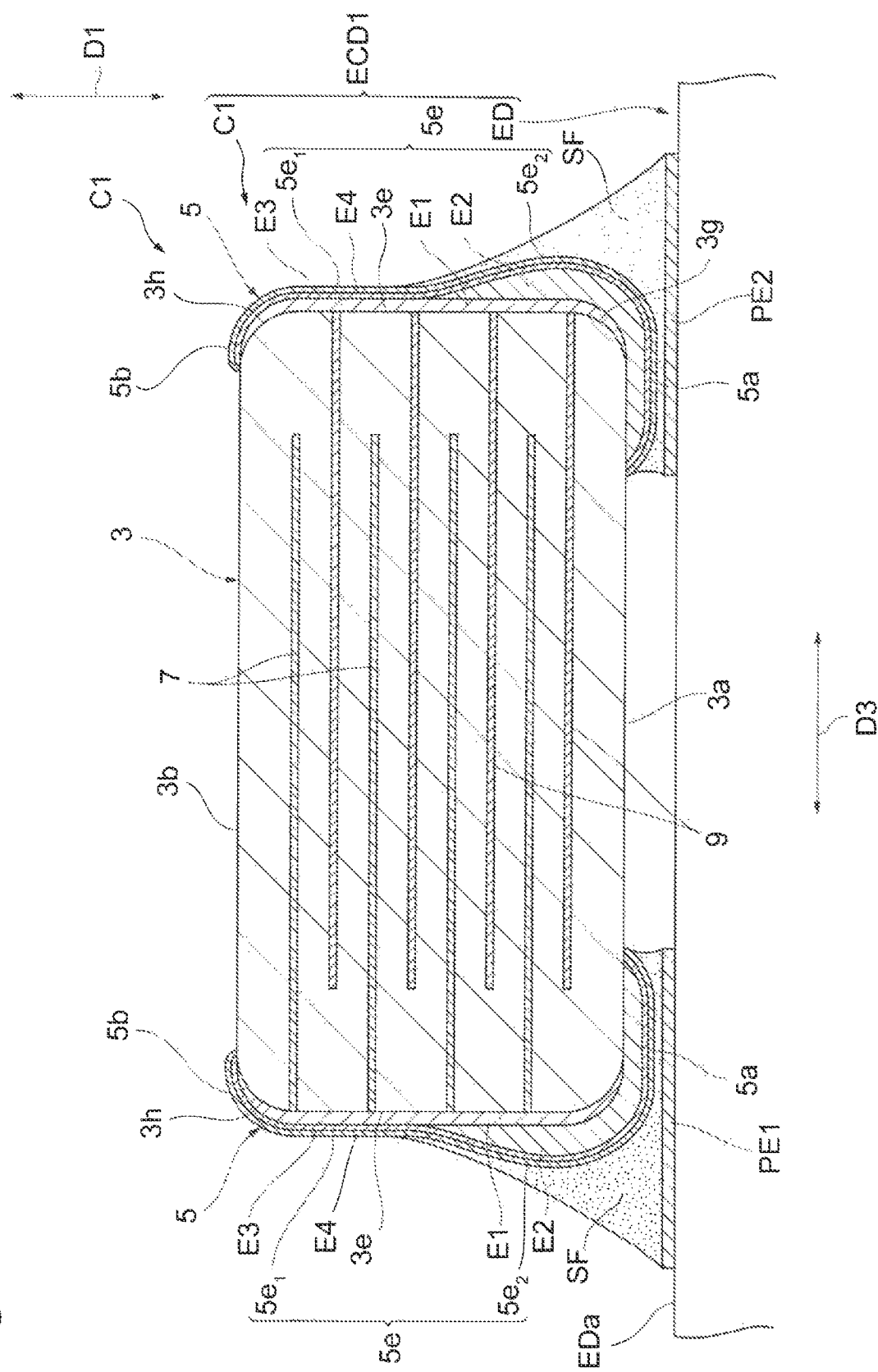
FIG. 9 is a view illustrating a mounting structure of the multilayer capacitor according to the first embodiment.

Next, a mounted structure of the multilayer capacitor C1 will be described with reference to FIG. 9. FIG. 9 is a view illustrating a mounted structure of a multilayer capacitor according to the first embodiment.

As illustrated in FIG. 9, an electronic component device ECD1 includes the multilayer capacitor C1 and an electronic device ED. The electronic device ED includes, for example, a circuit board or an electronic component. The multilayer capacitor C1 is solder-mounted on the electronic device ED. The electronic device ED includes a principal surface EDa and a plurality of pad electrodes PE1 and PE2. In the present embodiment, the electronic device ED includes two pad electrodes PE1 and PE2. Each of the pad electrodes PE1 and PE2 is disposed on the principal surface EDa. The two pad electrodes PE1 and PE2 are separated from each other. The multilayer capacitor C1 is disposed on the electronic device ED in such a manner that the principal surface 3a and the principal surface EDa oppose each other. As described above, the principal surface 3a is arranged to constitute a mounting surface. Each of the internal electrodes 7 and 9 is approximately parallel to the principal surface Eda.

When the multilayer capacitor C1 is solder-mounted, molten solder wets to the external electrodes 5 (fourth electrode layer E4). Solder fillets SF are formed on the external electrodes 5 by solidification of the wet solder. The external electrodes 5 and the pad electrodes PE1 and PE2 corresponding to each other are coupled via the solder fillets SF.

The solder fillet SF is formed on the regions $5e_1$ and $5e_2$ of the electrode portion $5e$. In addition to the region $5e_2$, the region $5e_1$ that does not include the second electrode layer E2 is also coupled to the corresponding pad electrode PE1 or PE2 via the solder fillet SF. When viewed from the third direction D3, the solder fillet SF overlaps the region $5e_1$ of the electrode portion $5e$. When viewed from the third direction D3, the solder fillet SF overlaps the first electrode layer E1 included in the region $5e_1$. Although illustration is omitted, the solder fillets SF are also formed on the regions $5c_1$ and $5c_2$ of the electrode portion $5c$. A height of the solder fillet SF in the first direction D1 is larger than a height of the second electrode layer E2 in the first direction D1. The solder fillet SF extends in the first direction D1 to be closer to the principal surface $3b$ than the end edge E2e of the second electrode layer E2.

As described above, the electronic component device ECD1 suppresses occurrence of a crack in the element body 3, and improves moisture resistance reliability.

In the electronic component device ECD1, when viewed from the third direction D3, the solder fillet SF overlaps the region $5e_1$ of the electrode portion $5e$. Therefore, even in a case in which the external electrode 5 includes the second electrode layer E2, the electronic component device ECD1 suppresses an increase in ESR.

In the electronic component device ECD1, it is discriminated that the plurality of internal electrodes 7 and 9 is disposed approximately in parallel with the principal surface EDa from the appearance of the multilayer capacitor C1 (element body 3).

Second Embodiment

Figure 10:
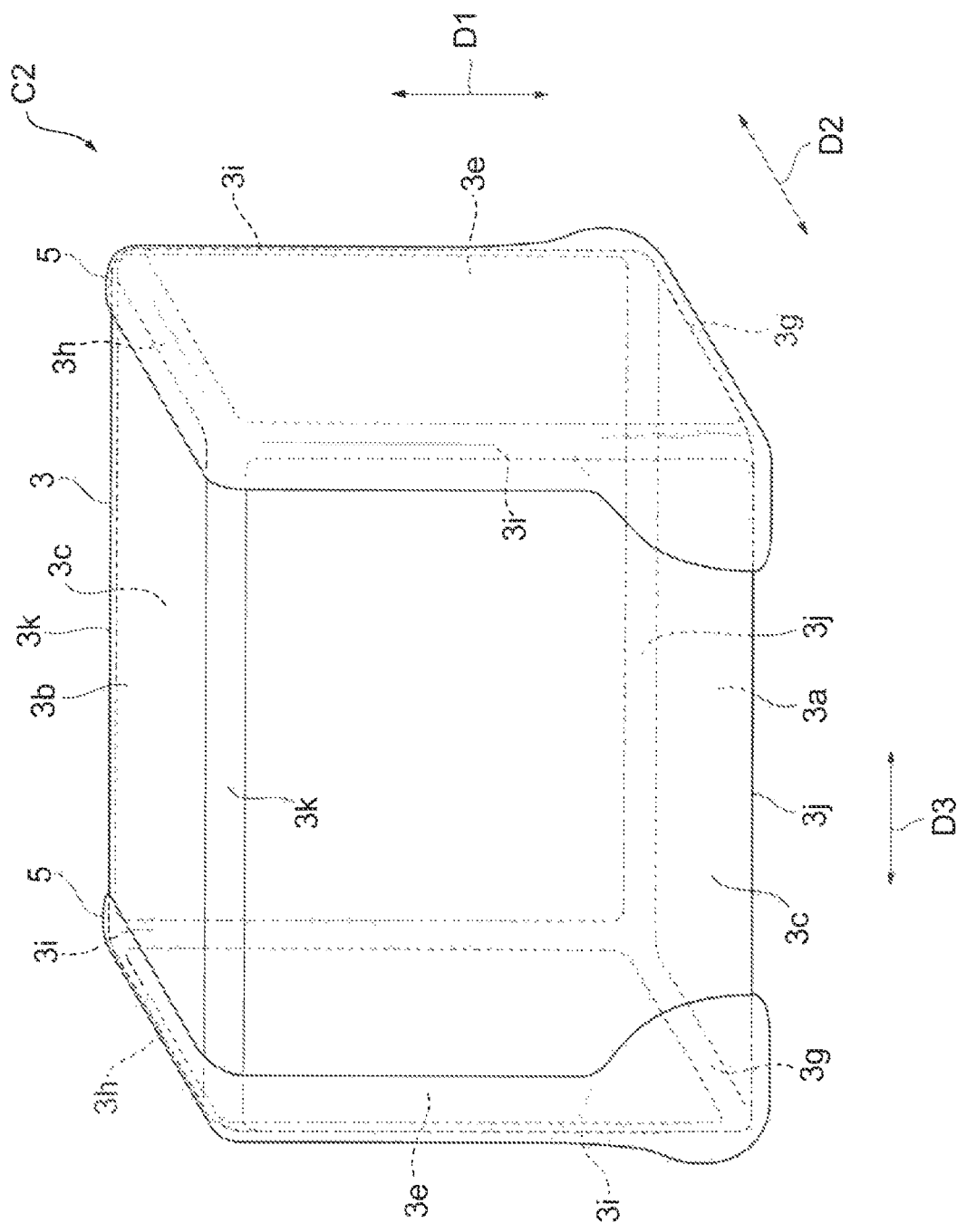
FIG. 10 is a perspective view of a multilayer capacitor according to a second embodiment.
Figure 11:
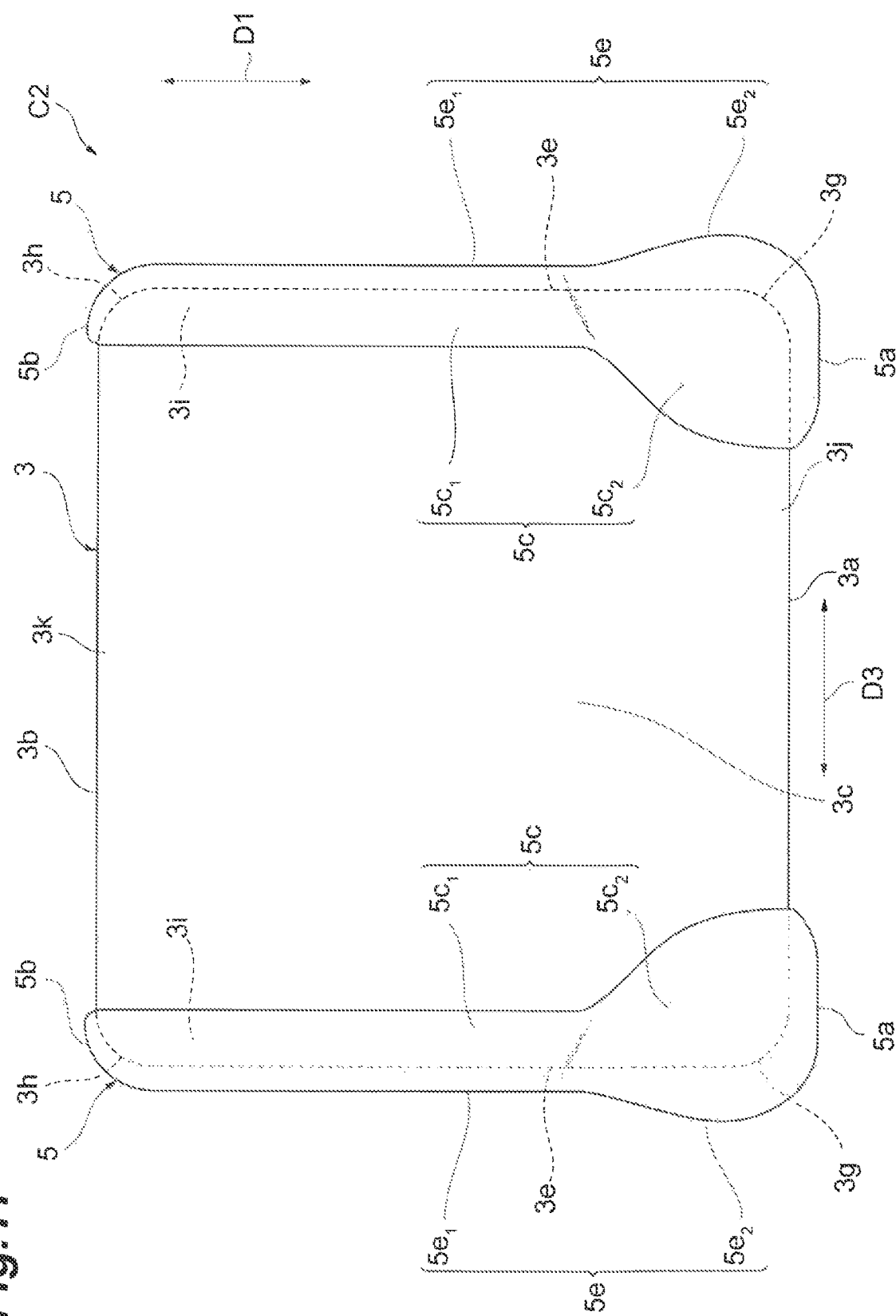
FIG. 11 is a side view of the multilayer capacitor according to the second embodiment.
Figure 12:
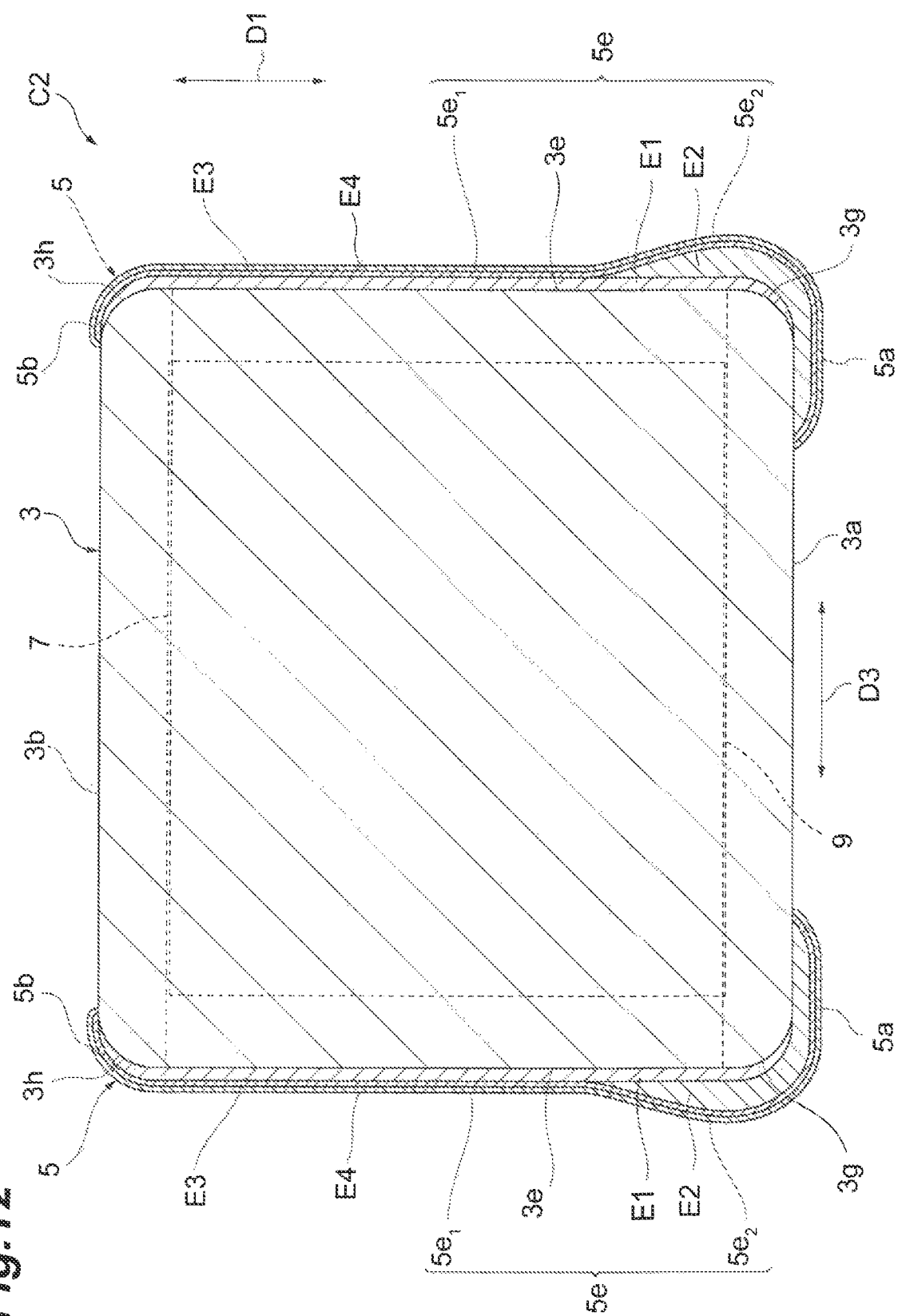
FIG. 12 is a view illustrating a cross-sectional configuration of the multilayer capacitor according to the second embodiment.
Figure 13:
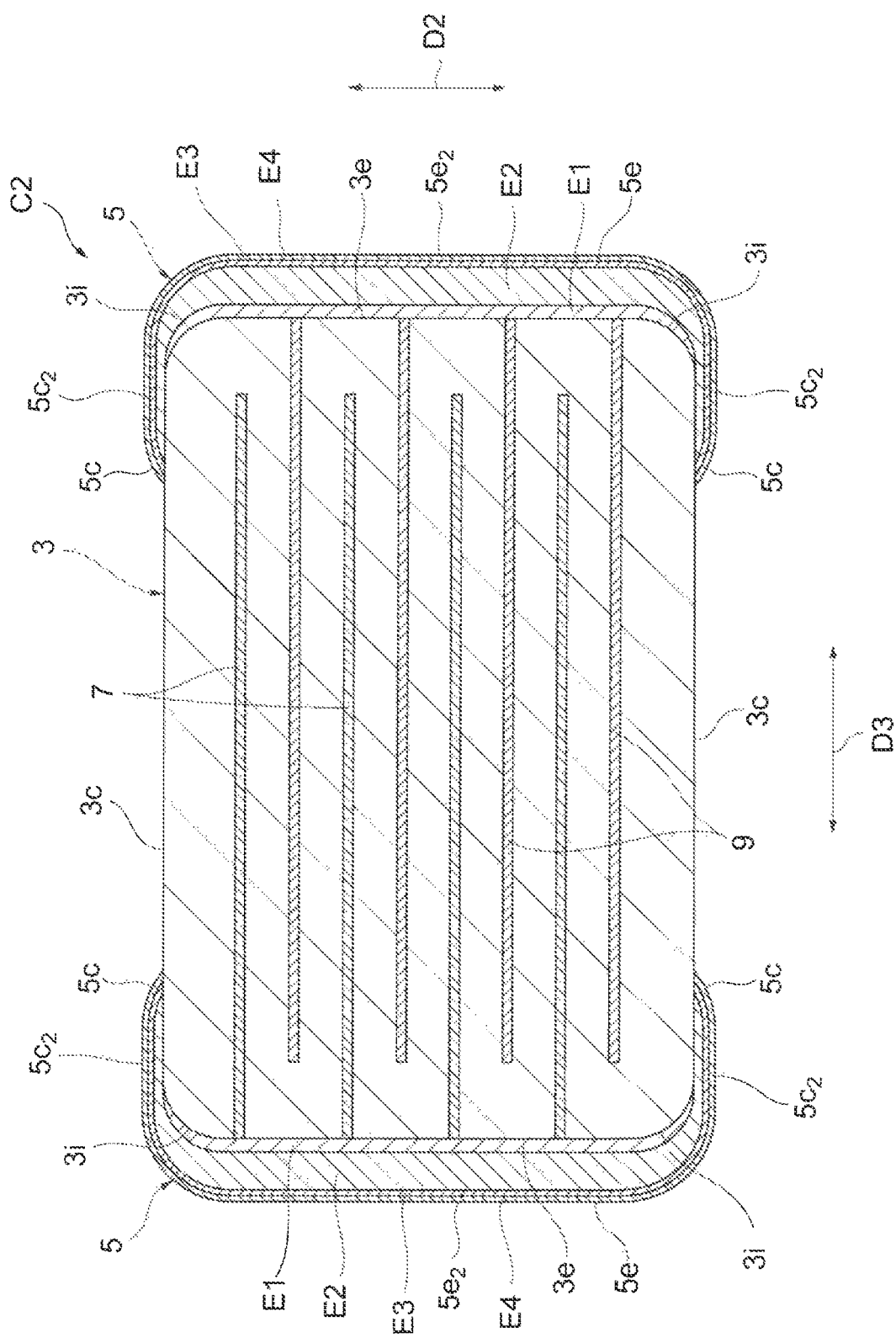
FIG. 13 is a view illustrating the cross-sectional configuration of the multilayer capacitor according to the second embodiment.
Figure 14:
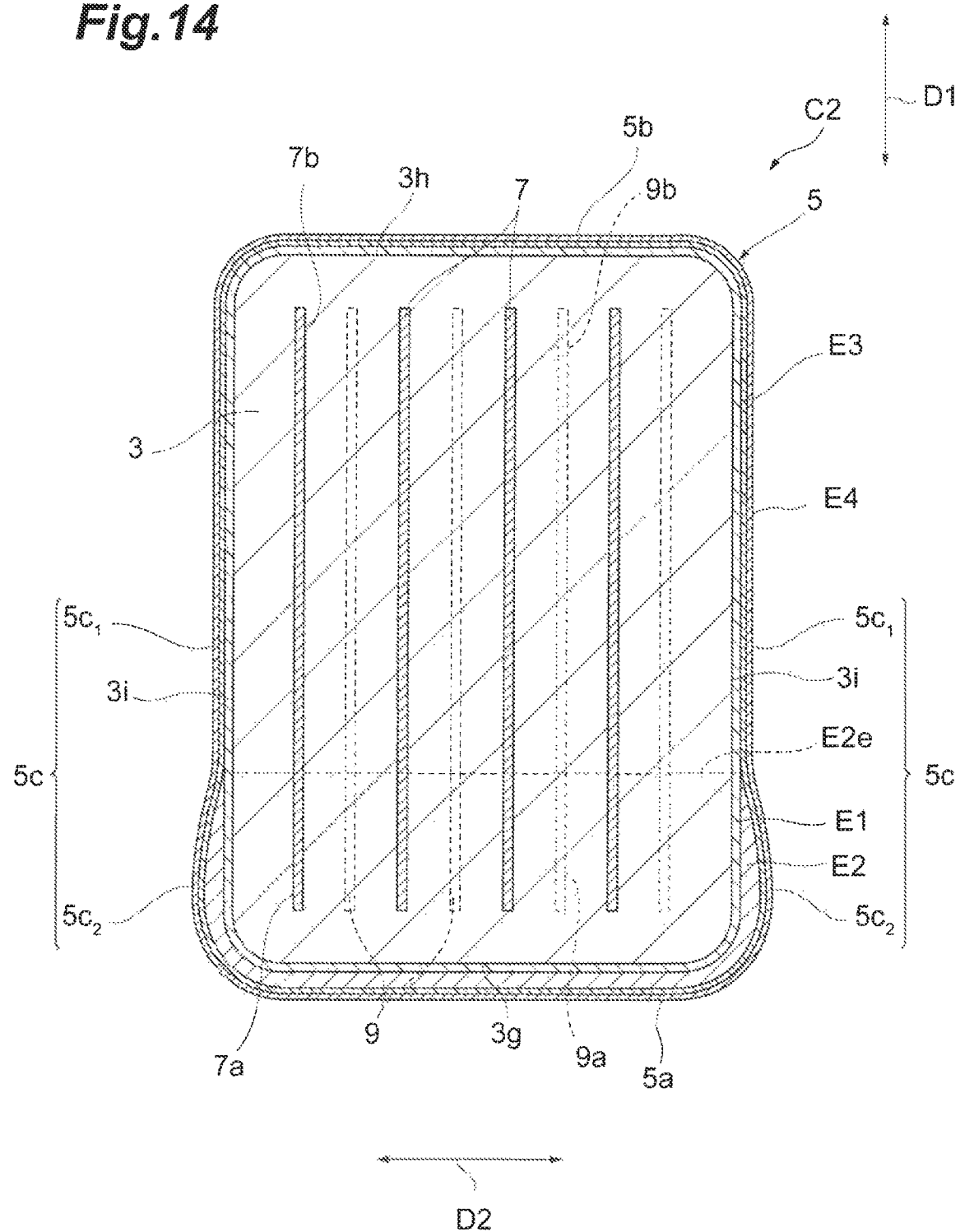
FIG. 14 is a view illustrating the cross-sectional configuration of the multilayer capacitor according to the second embodiment.
Figure 15:
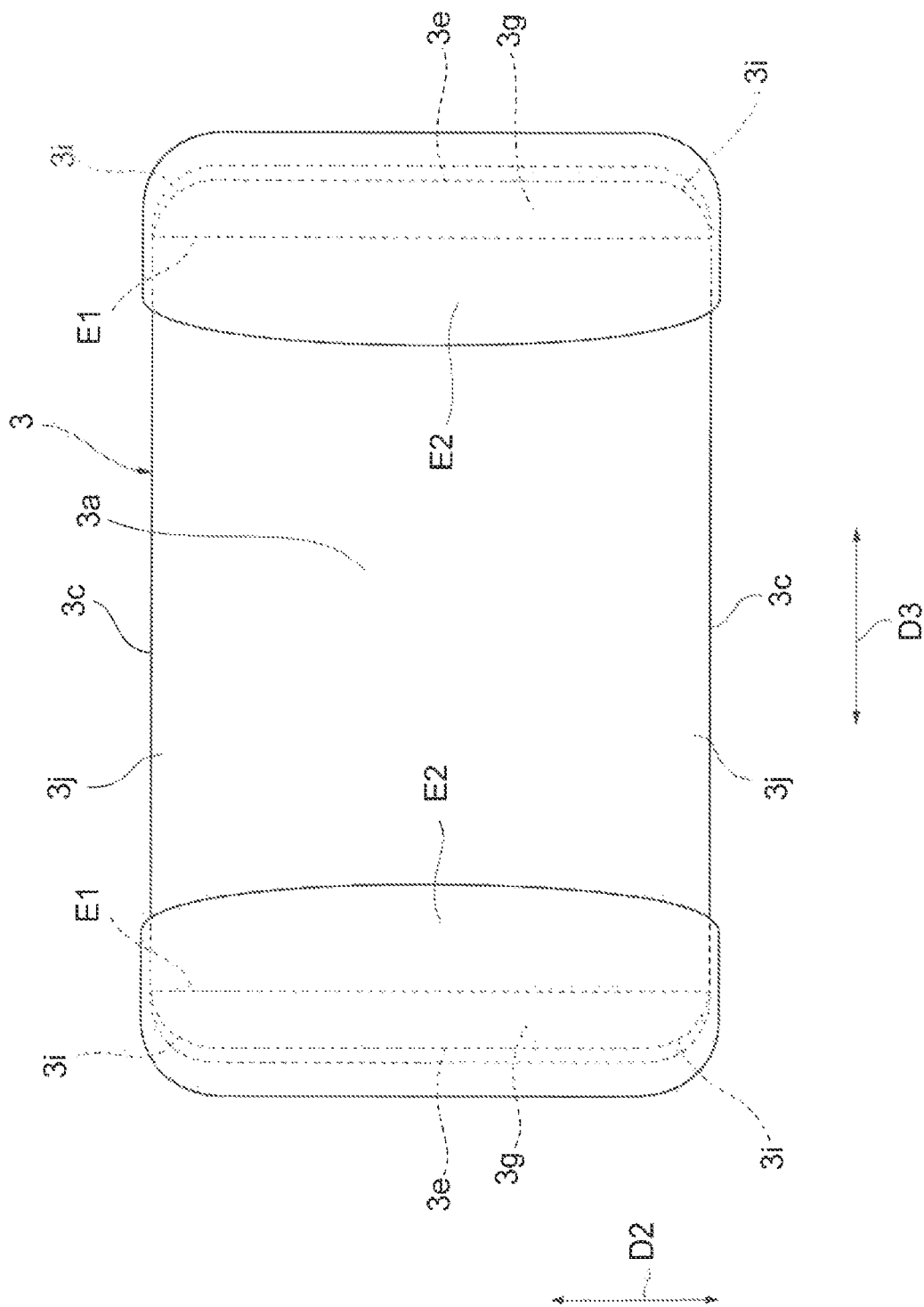
FIG. 15 is a plan view illustrating an element body, a first electrode layer, and a second electrode layer.
Figure 16:
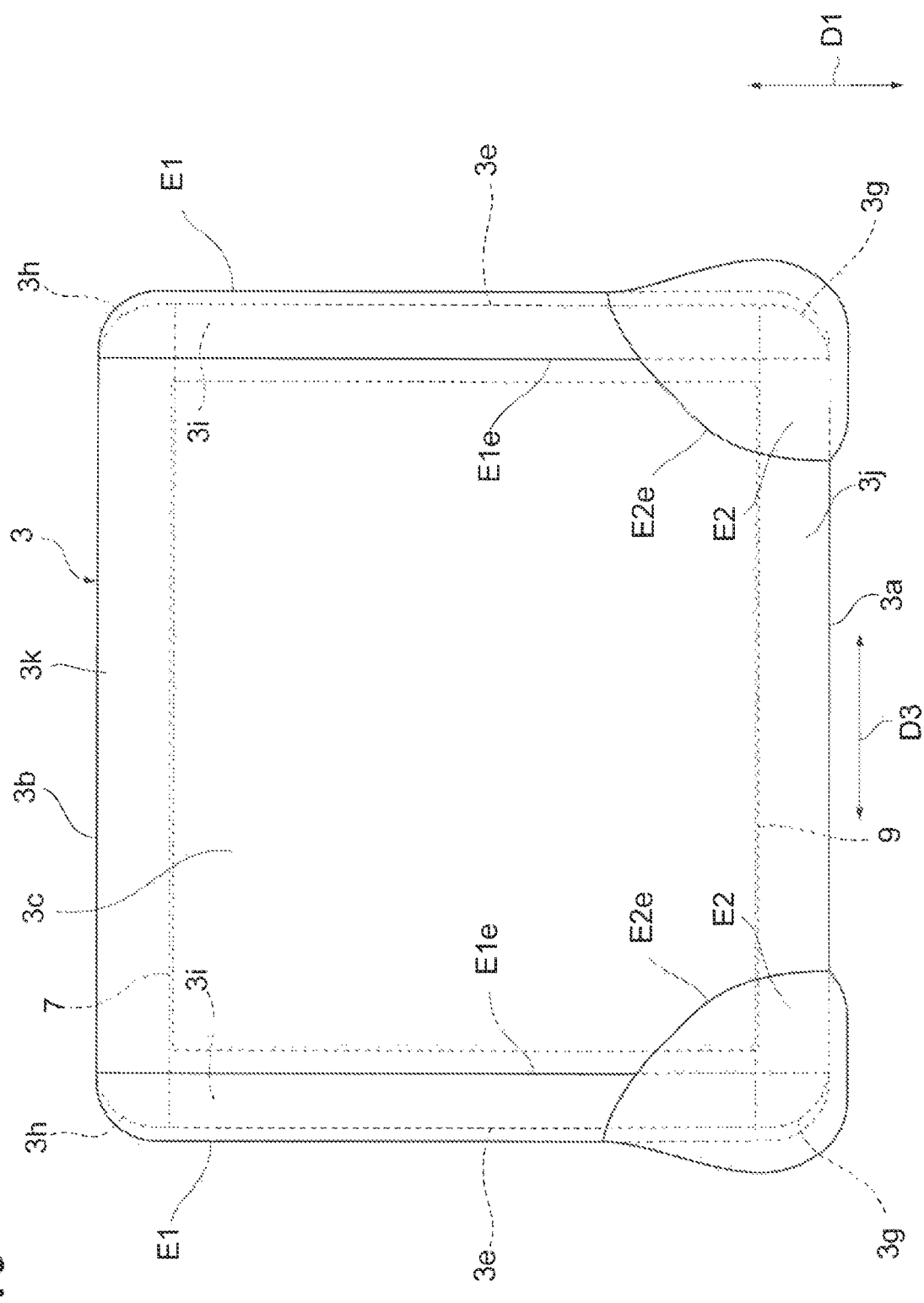
FIG. 16 is a side view illustrating the element body, the first electrode layer, and the second electrode layer.
Figure 17:
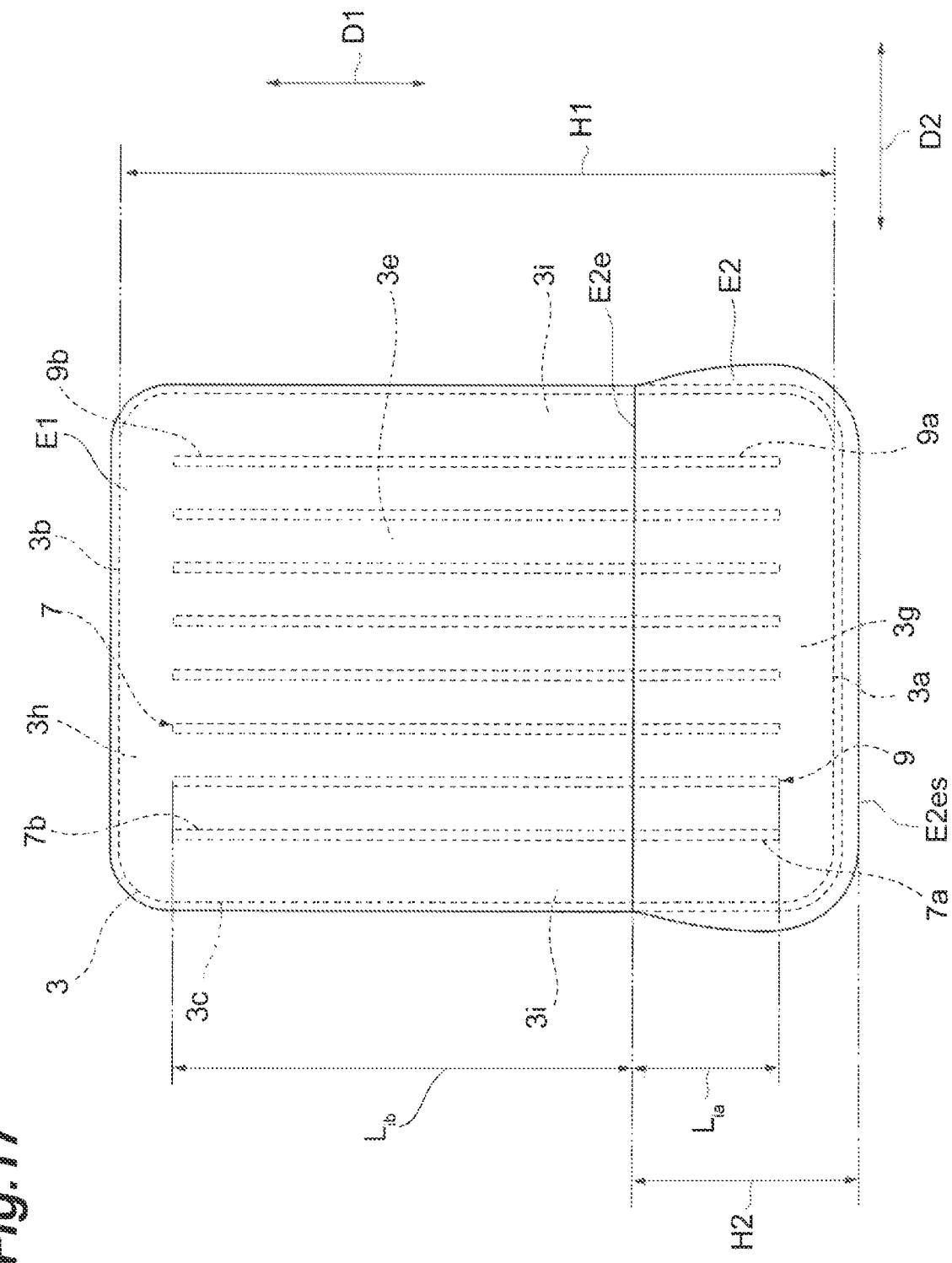
FIG. 17 is an end view illustrating the element body, the first electrode layer, and the second electrode layer.

A configuration of a multilayer capacitor C2 according to a second embodiment will be described with reference to FIGS. 10 to 17. FIG. 10 is a perspective view of the multilayer capacitor according to the second embodiment. FIG. 11 is a side view of the multilayer capacitor according to the second embodiment. FIGS. 12 to 14 are views illustrating a cross-sectional configuration of the multilayer capacitor according to the second embodiment. FIG. 15 is a plan view illustrating an element body, a first electrode layer, and a second electrode layer. FIG. 16 is a side view illustrating the element body, the first electrode layer, and the second electrode layer. FIG. 17 is an end view illustrating the element body, the first electrode layer, and the second electrode layer. In the second embodiment, an electronic component is, for example, the multilayer capacitor C2.

As illustrated in FIGS. 10 to 14, the multilayer capacitor C2 includes the element body 3, the pair of external electrodes 5, the plurality of internal electrodes 7, and the plurality of internal electrodes 9, in a similar manner to the multilayer capacitor C1. In the multilayer capacitor C2, a shape of the element body 3 and the direction in which the plurality of internal electrodes 7 and 9 is disposed are different from those in the multilayer capacitor C1. Hereinafter, differences between the multilayer capacitor C1 and the multilayer capacitor C2 will be mainly described.

The element body 3 includes the pair of principal surfaces 3a an 3b opposing each other, the pair of side surfaces 3c opposing each other, and the pair of end surfaces 3e opposing each other. The element body 3 includes the pair of ridge portions 3g, the pair of ridge portions 3h, the four ridge portions 3i, the pair of ridge portions 3j, and the pair of ridge portions 3k. In the second embodiment, the length of the element body 3 in the second direction D1 is larger than the length of the element body 3 in the first direction D2. The length of the element body 3 in the third direction D3 is larger than the length of the element body 3 in the first direction D1, and larger than the length of the element body 3 in the second direction D2. Also in the present embodiments, the third direction D3 is a longitudinal direction of the element body 3.

In the second embodiment, the element body 3 is configured by laminating the plurality of dielectric layers in the second direction D2. In the element body 3, the lamination direction of the plurality of dielectric layers coincides with the second direction D2. The plurality of internal electrodes 7 and the plurality of internal electrodes 9 are alternately disposed in the second direction D2. The internal electrodes 7 and 9 are located in a plane approximately orthogonal to the principal surfaces 3a and 3b. The internal electrodes 7 and the internal electrodes 9 oppose each other in the second direction D2. The direction (second direction D2) in which the internal electrodes 7 and the internal electrodes 9 oppose each other is orthogonal to the direction (first direction D1 or third direction D3) parallel to the side surfaces 3c.

The lamination direction of the plurality of dielectric layers may coincide with the first direction D1. In this case, the plurality of internal electrodes 7 and the plurality of internal electrodes 9 are alternately disposed in the first direction D1. The internal electrodes 7 and 9 are located in a plane approximately parallel to the principal surfaces 3a and 3h. The internal electrodes 7 and the internal electrodes 9 oppose each other in the first direction D1.

Also in the second embodiments, as illustrated in FIGS. 11 to 14, the external electrode 5 includes the plurality of electrode portions 5a, 5b, 5c, and 5e. The external electrode 5 includes the first electrode layer E1, the second electrode layers E2, the third electrode layer E3, and the fourth electrode layer E4. As illustrated in FIGS. 12 to 17, each of the electrode portions 5a, 5c, and 5e includes the first electrode layer E1, the second electrode layer E2, the third electrode layer E3, and the fourth electrode layer E4. The electrode portion 5b includes the first electrode layer E1, the third electrode layer E3, and the fourth electrode layer E4. The electrode portion 5a is four-layered on the ridge portion 3g, and is three-layered on the principal surface 3a. The electrode portion 5b is three-layered. The electrode portion 5c includes a plurality of regions $5c_1$ and $5c_2$. The region $5c_1$ is three-layered. The regions $5c_2$ is four-layered on the ridge portion 3i, and is three-layered on the side surface 3c. The electrode portion 5e includes a plurality of regions $5e_1$ and $5e_2$. The region $5e_1$ is three-layered. The regions $5e_2$ is four-layered.

As illustrated in FIG. 17, in the second embodiment, when viewed from the third direction D3, an area of the second electrode layer E2 located on the end surface 3e and the ridge portion 3g is smaller than an area of the first electrode layer E1 located on the end surface 3e and the ridge portion 3g. When viewed from the third direction D3, a height H2 of the second electrode layer E2 is not more than half of a height H1 of the element body 3. The one end of each of the internal electrodes 7 and 9 includes regions 7a and 9a overlapping with the second electrode layer E2 and regions 7b and 9b not overlapping with the second electrode layer E2, when viewed from the third direction D3. The regions 7a and 9a are located closer to the principal surface 3a in the first direction D1 than the regions 7b and 9b. The first electrode layer E1 included in the region $5e_2$ is connected to the corresponding regions 7a and 9a. The first electrode layer E1 included in the region $5e_1$ is connected to the corresponding regions 7b and 9b. When viewed from the third direction D3, the end edge E2e of the second electrode layer E2 crosses the one end of each of the internal electrodes 7 and 9. A length $L_{ia}$ of the regions 7a and 9a in the first direction D1 is smaller than a length $L_{ib}$ of the regions 7b and 9b in the first direction D1.

In the multilayer capacitor C2, the second electrode layer E2 (second electrode layer E2 included in the electrode portions 5a, 5c, and 5e) continuously covers the one part of the principal surface 3a, the one part of the end surface 3e, and the one part of each of the pair of side surfaces 3c, in a similar manner to the multilayer capacitor C1. Therefore, the external force applied onto the multilayer capacitor C2 from the electronic device tends not to act on the element body 3. Consequently, the multilayer capacitor C2 also suppresses occurrence of a crack: in the element body 3. The multilayer capacitor C2 also improves moisture resistance reliability, in a similar manner to the multilayer capacitor C1.

In the multilayer capacitor C2, the plurality of internal electrodes 7 and the plurality of internal electrodes 9 are disposed in the second direction D2. The length of the element body 3 in the first direction D1 is different from the length of the element body 3 in the second direction D2. Therefore, the direction in which the plurality of internal electrodes 7 and 9 is disposed in the element body 3 can be identified from an appearance of the multilayer capacitor C2 (element body 3).

In the multilayer capacitor C2, the length of the element body 3 in the first direction D1 is larger than the length of the element body 3 in the second direction D2. Therefore, the multilayer capacitor C2 enables high-density mounting of the multilayer capacitor C2.

In the multilayer capacitor C2, when viewed from the third direction D3, the height H2 of the second electrode layer E2 is not more than half of the height H1 of the element body 3. Therefore, paths through which moisture penetrates is further reduced in the multilayer capacitor C2, and thus the moisture resistance reliability is further improved. The multilayer capacitor C2 suppresses an increase in ESR, even in a case in which the external electrode 5 includes the second electrode layer E2.

In the multilayer capacitor C2, the plurality of internal electrodes 7 and 9 is disposed in the second direction D2, and is exposed to the corresponding end surface 3e. The external electrode 5 includes the first electrode layer E1 (first electrode layer E1 included in the electrode portion 5e). The first electrode layer E1 is formed on the end surface 3e to be connected to the corresponding internal electrodes 7 and 9. In this case, the multilayer capacitor C2 allows reliable electrical connection between the external electrode 5 and the internal electrodes 7 and 9 that correspond to each other.

In the multilayer capacitor C2, the principal surface 3a is arranged to constitute the mounting surface, and the plurality of internal electrodes 7 and 9 opposes each other in the second direction D2. Therefore, a current path formed for each of the internal electrodes 7 and 9 is short in the multilayer capacitor C2. Consequently, the multilayer capacitor C2 has low ESL.

In the multilayer capacitor C2, the first electrode layer E1 (first electrode layer E1 included in the electrode portion 5e) includes a region covered with the second electrode layer E2 (second electrode layer E2 included in the electrode portion 5e), and a region exposed from the second electrode layer E2 (second electrode layer E2 included in the electrode portion 5e). Therefore, as described above, the multilayer capacitor C2 suppresses the increase in ESR even when the external electrode 5 includes the second electrode layer E2.

In the multilayer capacitor C2, the one part of the portion of the first electrode layer E1 formed on the ridge portion 3i (e.g., first electrode layer E1 in the region $5c_1$) is exposed from the second electrode layer E2. The one part of the portion of the first electrode layer E1 formed on the ridge portion 3i includes, for example, the first electrode layer E1 in the region $5c_1$. Therefore, the multilayer capacitor C2 further suppresses the increase in ESR.

In the multilayer capacitor C2, the region of the first electrode layer E1 exposed from the second electrode layer E2 is electrically connected to the electronic device via the third electrode layer E3 and the fourth electrode layer E4. Therefore, the multilayer capacitor C2 further suppresses the increase in ESR.

In the multilayer capacitor C2, the first electrode layer E1 covers the ridge portions 3g and 3i. Therefore, even in a case in which the second electrode layer E2 peels off from the element body 3, the peel-off of the second electrode layer E2 tends not to develop to a position corresponding to the end surface 3e beyond a position corresponding to the ridge portions 3g and 3i.

In the multilayer capacitor C2, the second electrode layer E2 (second electrode layer E2 included in the electrode portions 5a and 5c) is formed to cover the one part of the portion of the first electrode layer E1 formed on the ridge portion 3i and the entire portion of the first electrode layer E1 formed on the ridge portion 3g. The one part of the portion of the first electrode layer E1 formed on the ridge portion 3i includes, for example, the first electrode layer E1 in the region $5c_2$. Therefore, the peel-off of the second electrode layer E2 further tends not to develop to the position corresponding to the end surface 3e.

Figure 18:
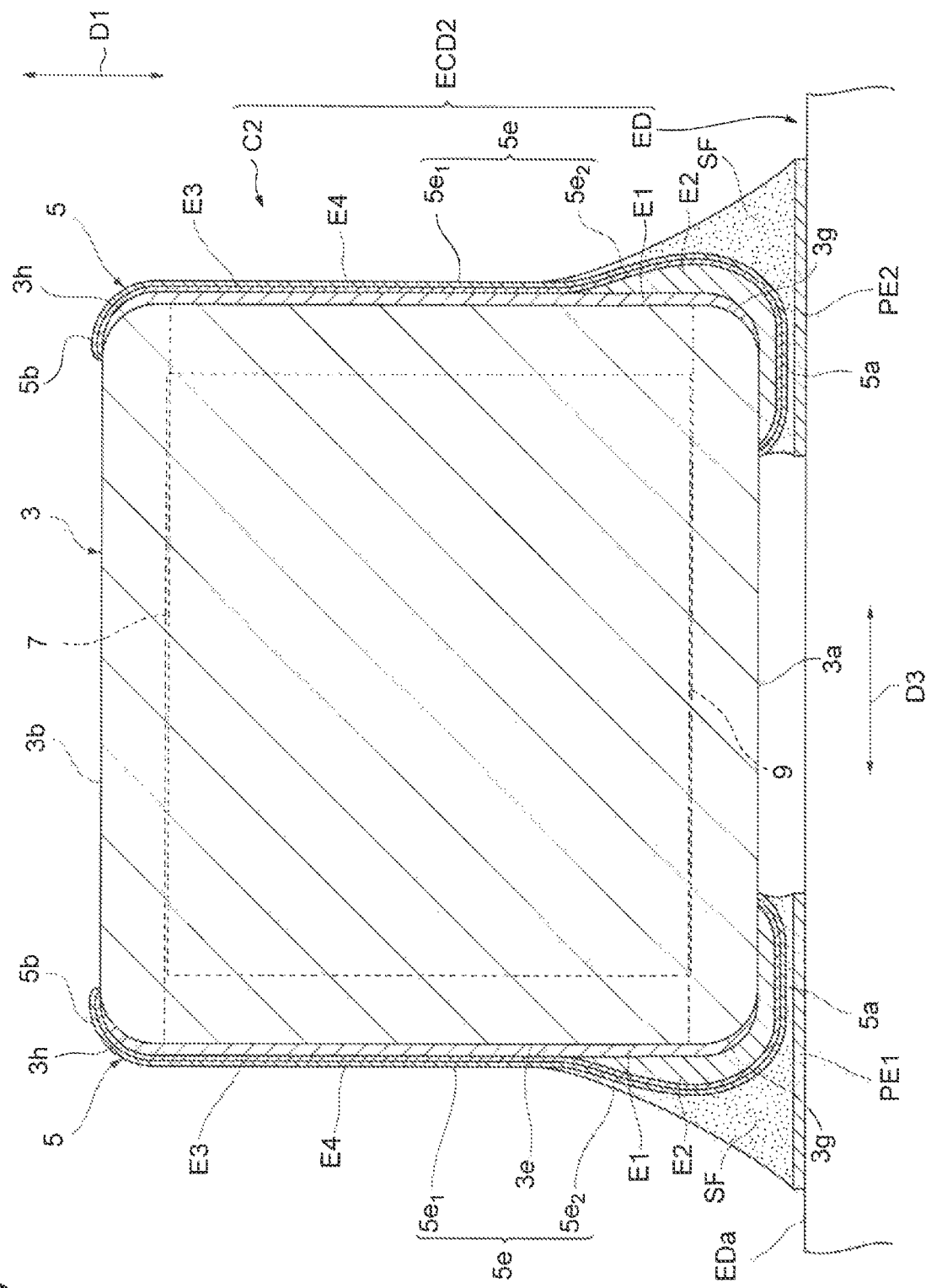
FIG. 18 is a view illustrating a mounting structure of the multilayer capacitor according to the second embodiment.

Next, a mounted structure of the multilayer capacitor C2 will be described with reference to FIG. 18. FIG. 18 is a view illustrating a mounted structure of a multilayer capacitor according to the second embodiment.

As illustrated in FIG. 18, an electronic component device ECD2 includes the multilayer capacitor C2 and the electronic device ED. Each of the internal electrodes 7 and 9 is approximately orthogonal to the principal surface Eda. The external electrodes 5 and the pad electrodes PE1 and PE2 corresponding to each other are coupled via the solder fillets SF. The solder fillet SF is formed on the regions $5e_1$ and $5e_2$ of the electrode portion 5e. When viewed from the third direction D3, the solder fillet SF overlaps the region $5e_1$ (first electrode layer E1 included in the region $5e_1$) of the electrode portion 5e. Although illustration is omitted, the solder fillets SF are also formed on the regions $5c_1$ and $5c_2$ of the electrode portion 5c. A height of the solder fillet SF in the first direction D1 is larger than a height of the second electrode layer E2 in the first direction D1. The solder fillet SF extends in the first direction D1 to be closer to the principal surface 3b than the end edge E2e of the second electrode layer E2.

The electronic component device ECD2 also suppresses occurrence of a crack in the element body 3 and improves moisture resistance reliability, as described above.

In the electronic component device ECD2, when viewed from the third direction D3, the solder fillet SF overlaps the region $5e_1$ of the electrode portion 5e. Therefore, even in a case in which the external electrode 5 includes the second electrode layer E2, the electronic component device ECD2 suppresses an increase in ESR.

In the electronic component device ECD2, it is discriminated that the plurality of internal electrodes 7 and 9 is disposed approximately in orthogonal with the principal surface EDa from the appearance of the multilayer capacitor C2 (element body 3).

Although the embodiments and modifications of the present invention have been described above, the present invention is not necessarily limited to the embodiments and modifications, and the embodiment can be variously changed without departing from the scope of the invention.

The first electrode layer E1 may be formed on the principal surface 3a to extend over the ridge portion 3g entirely or partially from the end surface 3e. The first electrode layer E1 may be formed on the principal surface 3b to extend beyond the ridge portion 3h entirely or partially from the end surface 3e. In a case in which the first electrode layer E1 is formed on the principal surface 3b, an electrode portion disposed on the principal surface 3b may be four-layered. The first electrode layer E1 may be formed on the side surface 3c to extend beyond the ridge portion 3i entirely or partially from the end surface 3e. In a case in which the first electrode layer E1 is formed on the side surface 3c, an electrode portion disposed on the side surface 3c may be four-layered. The number of internal electrodes 7 and 9 included in the multilayer capacitor C1 or C2 is not limited to the number of the internal electrodes 7 and 9 illustrated.

The electronic component of the first embodiment is the multilayer capacitor C1, and the electronic component of the second embodiment is also the multilayer capacitor C2. Applicable electronic component is not limited to the multilayer capacitor. Examples of the applicable electronic components include, but not limited to, multilayer electronic components such as a multilayer feedthrough capacitor, a multilayer inductor, a multilayer varistor, a multilayer piezoelectric actuator, a multilayer thermistor, or a multilayer composite component, and electronic components other than the multilayer electronic components.

What is claimed is:

1. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction;
a plurality of internal conductors disposed in the element body to be disposed in a predetermined direction of the first direction and second direction; and
a plurality of external electrodes disposed at both end portions of the element body in the third direction, wherein
a first length of the element body in the first direction is different from a second length of the element body in the second direction, and
the external electrode includes a conductive resin layer continuously covering one part of the first principal surface, one part of an end surface of the pair of end surfaces, and one part of each of the pair of side surfaces, and
when viewed from the second direction, a length of the conductive resin layer in the first direction decreases with respect to an increase in distance from the end surface in the third direction.

2. The electronic component according to claim 1, wherein the second length is larger than the first length.

3. The electronic component according to claim 2, wherein when viewed from the third direction, a height of the conductive resin layer is half or more of a height of the element body.

4. The electronic component according to claim 2, wherein the plurality of internal conductors is disposed in the first direction and is exposed to a corresponding end surface of the pair of end surfaces, and
the external electrode further includes a sintered metal layer formed on the corresponding end surface to be connected to a corresponding internal conductor of the plurality of internal conductors.

5. The electronic component according to claim 4, wherein the sintered metal layer includes a first region covered with the conductive resin layer, and a second region exposed from the conductive resin layer.

6. The electronic component according to claim 5, wherein the external electrode further includes a plating layer covering the conductive resin layer and the second region of the sintered metal layer.

7. The electronic component according to claim 4, wherein the sintered metal layer is also formed on a first ridge portion positioned between the corresponding end surface and the side surface and on a second ridge portion positioned between the corresponding end surface and the first principal surface.

8. The electronic component according to claim 7, wherein the conductive resin layer covers one part of a portion of the sintered metal layer formed on the first ridge portion and an entire portion of the sintered metal layer formed on the second ridge portion.

9. The electronic component according to claim 7, wherein the one part of the portion of the sintered metal layer formed on the first ridge portion is exposed from the conductive resin layer.

10. The electronic component according to claim 1, wherein the first length is larger than the second length.

11. The electronic component according to claim 10, wherein when viewed from the third direction, a height of the conductive resin layer is not more than half of a height of the element body.

12. The electronic component according to claim 10, wherein the plurality of internal conductors is disposed in the second direction and is exposed to a corresponding end surface of the pair of end surfaces, and
the external electrode further includes a sintered metal layer formed on the corresponding end surface to be connected to a corresponding internal conductor of the plurality of internal conductors.

13. The electronic component according to claim 12, wherein the sintered metal layer includes a first region covered with the conductive resin layer, and a second region exposed from the conductive resin layer.

14. The electronic component according to claim 13, wherein the external electrode further includes a plating layer covering the conductive resin layer and the second region of the sintered metal layer.

15. The electronic component according to claim 12, wherein the sintered metal layer is also formed on a first ridge portion positioned between the corresponding end surface and the side surface and on a second ridge portion positioned between the corresponding end surface and the first principal surface.

16. The electronic component according to claim 15, wherein the conductive resin layer covers one part of a portion of the sintered metal layer formed on the first ridge portion and an entire portion of the sintered metal layer formed on the second ridge portion.

17. The electronic component according to claim 15, wherein the one part of the portion of the sintered metal layer formed on the first ridge portion is exposed from the conductive resin layer.

18. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
an external electrode disposed on an end portion of the element body in the third direction, wherein
a first length of the element body in the first direction is different from a second length of the element body in the second direction, and
the external electrode includes a conductive resin layer continuously covering one part of the first principal surface, one part of an end surface of the pair of end surfaces, and one part of each of the pair of side surfaces,
when viewed from the second direction, a length of the conductive resin layer in the first direction decreases with respect to an increase in distance from the end surface in the third direction.

19. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
an external electrode disposed on an end portion of the element body in the third direction, wherein
a first length of the element body in the first direction is different from a second length of the element body in the second direction,
the external electrode includes a conductive resin layer continuously covering one part of the first principal surface, one part of an end surface of the pair of end surfaces, and one part of each of the pair of side surfaces, and
when viewed from the second direction, an end edge of the conductive resin layer is approximately arc-shaped.

20. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
an external electrode disposed on an end portion of the element body in the third direction, wherein
a first length of the element body in the first direction is different from a second length of the element body in the second direction,
the external electrode includes a conductive resin layer continuously covering one part of the first principal surface, one part of an end surface of the pair of end surfaces, and one part of each of the pair of side surfaces, and
the conductive resin layer includes a region disposed on the side surface, and the region is approximately fan-shaped when viewed from the second direction.

* * * * *